United States Patent
Inagaki

(10) Patent No.: US 8,892,173 B2
(45) Date of Patent: Nov. 18, 2014

(54) MOBILE ELECTRONIC DEVICE AND SOUND CONTROL SYSTEM

(75) Inventor: Tomohiro Inagaki, Yokohama (JP)

(73) Assignee: Kyocera Corporation, Kyoto-Shi, Kyoto (JP)

( * ) Notice: Subject to any disclaimer, the term of this patent is extended or adjusted under 35 U.S.C. 154(b) by 24 days.

(21) Appl. No.: 13/807,932

(22) PCT Filed: Jul. 1, 2011

(86) PCT No.: PCT/JP2011/065191
§ 371 (c)(1),
(2), (4) Date: Jan. 2, 2013

(87) PCT Pub. No.: WO2012/002537
PCT Pub. Date: Jan. 5, 2012

(65) Prior Publication Data
US 2013/0102362 A1    Apr. 25, 2013

(30) Foreign Application Priority Data

Jul. 1, 2010  (JP) ................................. 2010-151300
Jul. 1, 2010  (JP) ................................. 2010-151301

(51) Int. Cl.
| H04M 1/00 | (2006.01) |
| H03G 5/02 | (2006.01) |
| H04M 1/725 | (2006.01) |
| H03G 5/00 | (2006.01) |
| H03G 9/02 | (2006.01) |
| H04M 1/60 | (2006.01) |
| H04R 3/04 | (2006.01) |
| G10L 21/02 | (2013.01) |
| G10L 25/60 | (2013.01) |

(52) U.S. Cl.
CPC ................... *H04M 1/60* (2013.01); *H03G 5/02* (2013.01); *H04M 1/72563* (2013.01); *G10L 21/0205* ; (2013.01); *H04R 2430/01* (2013.01); *G10L 25/60* (2013.01); *H03G 5/005* (2013.01); *H03G 9/025* (2013.01); *H04M 1/6016* (2013.01); *H04R 2499/11* (2013.01); *H04R 3/04* (2013.01)
USPC ..................... 455/569.1; 455/563; 455/550.1

(58) Field of Classification Search
CPC .......... H04M 1/00; H04R 1/225; H04R 1/20; H04R 25/40; H04R 25/405; H04R 2499/11
USPC ................... 455/569.1, 563, 550.1
See application file for complete search history.

(56) References Cited

U.S. PATENT DOCUMENTS

2010/0322430 A1* 12/2010 Isberg ............................ 381/58

FOREIGN PATENT DOCUMENTS

| JP | 2000-209698 A | 7/2000 |
| JP | 2004-294917 A | 10/2004 |

(Continued)

OTHER PUBLICATIONS

International Search Report for PCT/JP2011/065191 mailed Oct. 4, 2011.

*Primary Examiner* — Christian Hannon
(74) *Attorney, Agent, or Firm* — Lowe Hauptman & Ham, LLP

(57) ABSTRACT

According to an aspect, a mobile electronic device includes: a sound production unit for producing a sound based on a sound signal; an input unit for receiving input; a processing unit configured to cause the sound production unit to produce a sound, and set, when a response to the produced sound is received by the input unit, a compensation parameter for adjusting sound volume for each audio frequency based on the response; and a compensation unit configured to compensate a sound signal based on the compensation parameter, and supply the compensated sound signal to the sound production unit.

13 Claims, 20 Drawing Sheets

(56) References Cited

FOREIGN PATENT DOCUMENTS

| | | | |
|---|---|---|---|
| JP | 2009-086481 A | 4/2009 |
| JP | 2009-147629 A | 7/2009 |
| JP | 2009-288354 A | 12/2009 |
| JP | 2010-028515 A | 2/2010 |
| JP | 2010-081523 A | 4/2010 |

* cited by examiner

SOUND SIGNAL  TIME

MOBILE ELECTRONIC DEVICE AND SOUND CONTROL SYSTEM

CROSS-REFERENCE TO RELATED APPLICATION

This application is a National Stage of PCT international application Ser. No. PCT/JP2011/065191 filed on Jul. 1, 2011 which designates the United States, and which is based upon and claims the benefit of priority from Japanese Patent Application No. 2010-151300, filed on Jul. 1, 2010, and Japanese Patent Application No. 2010-151301, filed on Jul. 1, 2010.

FIELD

The present disclosure relates to a mobile electronic device and a sound control system that output a sound.

BACKGROUND

Mobile electronic devices such as a mobile phone and a mobile television produce sounds. Due to hearing impairment resulting from aging or the other factors, some users of the mobile electronic devices feel difficulties in hearing the produced sound.

To address that problem, Patent Literature 1 describes a mobile device with a sound compensating function for compensating the frequency characteristics and the level of sound produced from a receiver or the like according to age-related auditory change.

CITATION LIST

Patent Literature

Patent Literature 1: Japanese Patent Application Laid-Open No. 2000-209698

TECHNICAL PROBLEM

Hearing impairment has various causes such as aging, disease, and exposure to noise, and has various degrees. Therefore, the sound cannot be compensated enough for a user only by compensating the frequency characteristics and the level of sound output from a receiver or the like according to the user's age as described in Patent Literature 1.

For the foregoing reasons, there is a need for a mobile electronic device and a sound control system which are capable of adequately compensating the sound to be output so as to output the sound more easily heard by the user.

SUMARY

According to an aspect, a mobile electronic device includes: a housing; a sound production unit provided in the housing for producing a sound based on a sound signal; an input unit provided in the housing for receiving input; a processing unit configured to cause the sound production unit to produce a sound and set, when a response to the produced sound is received by the input unit, a compensation parameter for adjusting sound volume for each audio frequency based on the response; and a compensation unit configured to compensate a sound signal based on the compensation parameter and supply the compensated sound signal to the sound production unit.

According to another aspect, the mobile electronic device further includes an image display unit provided in the housing for displaying an image. The input unit has an operating unit for receiving input of operation, and the processing unit is configured to cause the image display unit to display a list of responses which are supposed to be input with respect to the sound produced by the sound production unit and set, when the operating unit is operated to select a response from the displayed list of responses, the compensation parameter correspondingly to the selected response.

According to another aspect, the input unit has a voice input unit for receiving voice input, and the processing unit is configured to analyze the voice of a response input into the voice input unit and set the compensation parameter correspondingly to the response based on the analysis.

According to another aspect, the compensation parameter is a parameter for compensating a sound to be produced from the sound production unit to make the sound have volume between an unpleasant threshold and an audible threshold.

According to another aspect, the processing unit is configured to cause the sound production unit to produce either or both of a sound which is smaller than an unpleasant threshold and a sound which is louder than an audible threshold.

According to another aspect, the mobile electronic device further includes: a communication unit for communicating with an external appliance; and an analysis unit for analyzing a received voice of a call received by the communication unit. When a response to the received voice is detected, the processing unit is configured to set the compensation parameter correspondingly to the analysis made by the analysis unit and the detected response.

According to another aspect, the processing unit is configured to store, when input for adjusting the received voice is detected during a call, that the input for adjusting the received voice is received and set the compensation parameter correspondingly to the input for adjusting the received voice.

According to another aspect, the analysis unit is configured to perform spectrum analysis on the received voice of a call, and the processing unit is configured to present options for the response based on the result of the spectrum analysis and take a response selected from the presented options as an input response.

According to another aspect, the processing unit is configured to store that the response received by the input unit is input and present the input response to a user in response to an instruction from the user.

According to another aspect, the mobile electronic device further includes an image display unit provided in the housing for displaying an image. The input unit is an operating unit provided in the housing for receiving input of operation, and the processing unit is configured to compare an output sound output from the sound production unit with an input character input from the operating unit and set the compensation parameter for each frequency corresponding to the sound for which the output sound does not agree with the input character.

According to another aspect, the compensation parameter is a parameter for compensating a sound to be produced from the sound production unit to make the sound have volume between an unpleasant threshold and an audible threshold.

According to another aspect, the processing unit is configured to decrease, when the sound for which the output sound does not agree with the input character is an output closer to the unpleasant threshold than to the audible threshold, the unpleasant threshold value of a wavelength region for the corresponding sound and increase, when the sound for which the output sound does not agree with the input character is an output closer to the audible threshold than to the unpleasant threshold, the processing unit is configured, the audible threshold of a wavelength region for the corresponding sound.

According to another aspect, the processing unit is configured to produce at least either of a sound which is smaller than the unpleasant threshold and a sound which is louder than the audible threshold as the output sound from the sound production unit.

According to another aspect, the processing unit is configured to determine a sound by classifying the sound into a vowel, a voiced consonant, and a voiceless consonant.

According to another aspect, A sound control system includes: a sound production unit for producing a sound based on a sound signal; an input unit for receiving input; a processing unit configured to cause the sound production unit to produce a sound and set, when a response to the produced sound is received by the input unit, a compensation parameter for adjusting sound volume for each audio frequency based on the response; a compensation unit configured to compensate a sound signal based on the compensation parameter and supply the compensated sound signal to the sound production unit; and a communication unit for transmitting or receiving a signal between the compensation unit and respective other components via a wired connection or a wireless connection. The sound production unit and the input unit are provided in a housing which can be carried by a user.

According to another aspect, either or both of the compensation unit and the processing unit are provided in a server.

ADVANTAGEOUS EFFECTS OF INVENTION

The present invention has an effect of being capable of adequately compensating the sound to be output according to individual user's hearing ability so as to output the sound more easily heard by the user.

BRIEF DESCRIPTION OF DRAWINGS

FIG. 19B is a diagram illustrating a display representing an image for selecting and inputting which of the high-pitched sound and the low-pitched sound the user is dissatisfied with.

DESCRIPTION OF EMBODIMENTS

The present invention will be described in detail below with reference to the drawings. The present invention should not be limited by the description below. The constituent elements in the description below include what can be easily thought of by those skilled in the art, what is substantially identical with the constituent element, and what falls within the scope of so-called equivalents. Although a mobile phone will be described below as an example of a mobile electronic device, the application object of the present invention is not limited to the mobile phones, and the present invention can be applied to PHSs (Personal Handy-phone System), PDAs (Personal Digital Assistant), portable navigation devices, notebook computers, gaming devices, etc.

Figure 1:
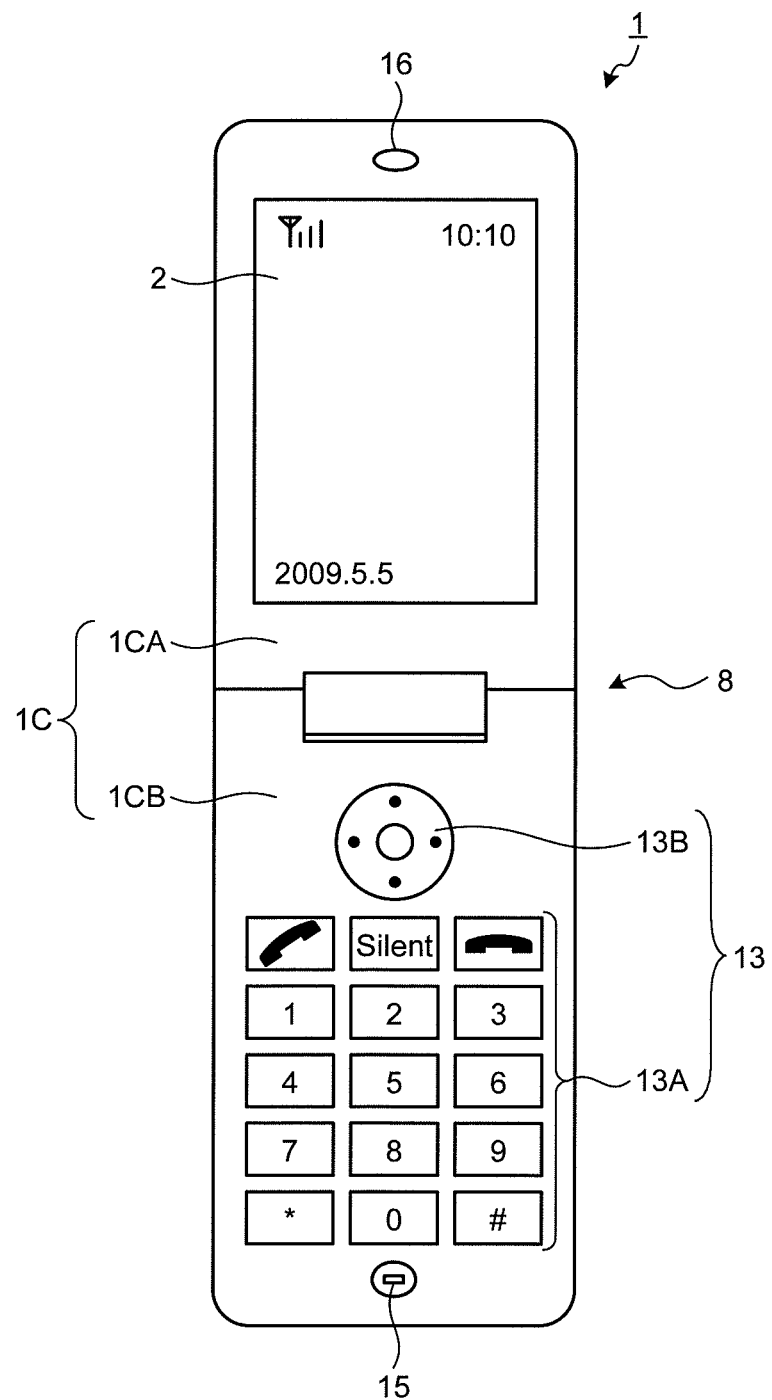
FIG. 1 is a front elevation view schematically illustrating a configuration of a mobile electronic device according to an embodiment.
Figure 2:
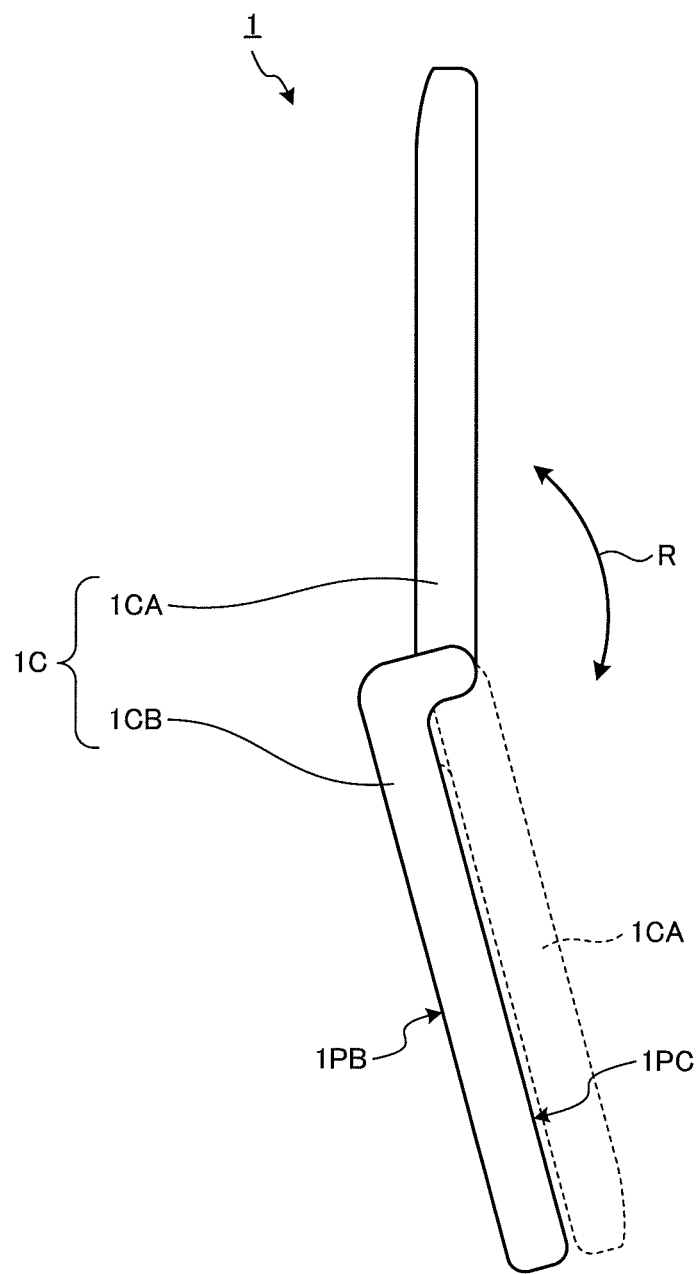
FIG. 2 is a side view illustrating the mobile electronic device illustrated in FIG. 1.

FIG. 1 is a front elevation view schematically illustrating a configuration of a mobile electronic device according to an embodiment, and FIG. 2 is a side view of the mobile electronic device illustrated in FIG. 1. The mobile electronic device 1 illustrated in FIGS. 1 and 2 is a mobile phone including a wireless communication function, an output means, and a sound capture means. The mobile electronic device 1 has a housing 1C including a plurality of housings. Specifically, the housing 1C includes a first housing 1CA and a second housing 1CB which are configured to be opened and closed. That is, the mobile electronic device 1 has a foldable housing. However, the housing of the mobile electronic device 1 is not limited to that configuration. For example, the housing of the mobile electronic device 1 may be a sliding housing including two housings which are configured to slide on each other from the state where they are placed on each other, or may be a housing including two rotatable housings one of which is capable of rotating on an axis along the direction of placing the two housings, or may be a housing including two housings which are coupled to each other via a biaxial hinge.

The first housing 1CA and the second housing 1CB are coupled to each other by a hinge mechanism 8, which is a junction. Coupled with the hinge mechanism 8, the first housing 1CA and the second housing 1CB can rotate on the hinge mechanism 8 to be apart from each other and close each other (in the direction indicated by an arrow R of FIG. 2). When the first housing 1CA and the second housing 1CB rotate to be apart from each other, the mobile electronic device 1 opens, and when the first housing 1CA and the second housing 1CB rotate to be close each other, the mobile electronic device 1 closes to be in the folded state (the state illustrated by the dotted line of FIG. 2).

The first housing 1CA is provided with a display 2 illustrated in FIG. 1 as a display unit. The display 2 displays a standby image while the mobile electronic device 1 is waiting for receiving a call, and displays a menu screen which is used to support operations to the mobile electronic device 1. The first housing 1CA is provided with a receiver 16, which is an output means for outputting sound during a call of the mobile electronic device 1.

The second housing 1CB is provided with a plurality of operation keys 13A for inputting a telephone number to call and characters in composing an email or the like, and a direction and decision keys 13B for facilitating selection and confirmation of a menu displayed on the display 2 and for facilitating the scrolling or the like of the screen. The operation keys 13A and the direction and decision keys 13B constitute the operating unit 13 of the mobile electronic device 1. The second housing 1CB is also provided with a microphone 15, which is a sound capture means for capturing sound during a call of the mobile electronic device 1. The operating unit 13 is provided on an operation face 1PC of the second housing 1CB illustrated in FIG. 2. The other side of the operation face 1PC is the backside 1PB of the mobile electronic device 1.

Inside the second housing 1CB, an antenna is provided. The antenna, which is a transmitting and receiving antenna for use in the radio communication, is used in transmitting and receiving radio waves (electromagnetic waves) of a call, an email or the like between the mobile electronic device 1 and a base station. The second housing 1CB is also provided with the microphone 15. The microphone 15 is placed on the operation face 1PC side of the mobile electronic device 1 illustrated in FIG. 2.

Figure 3:
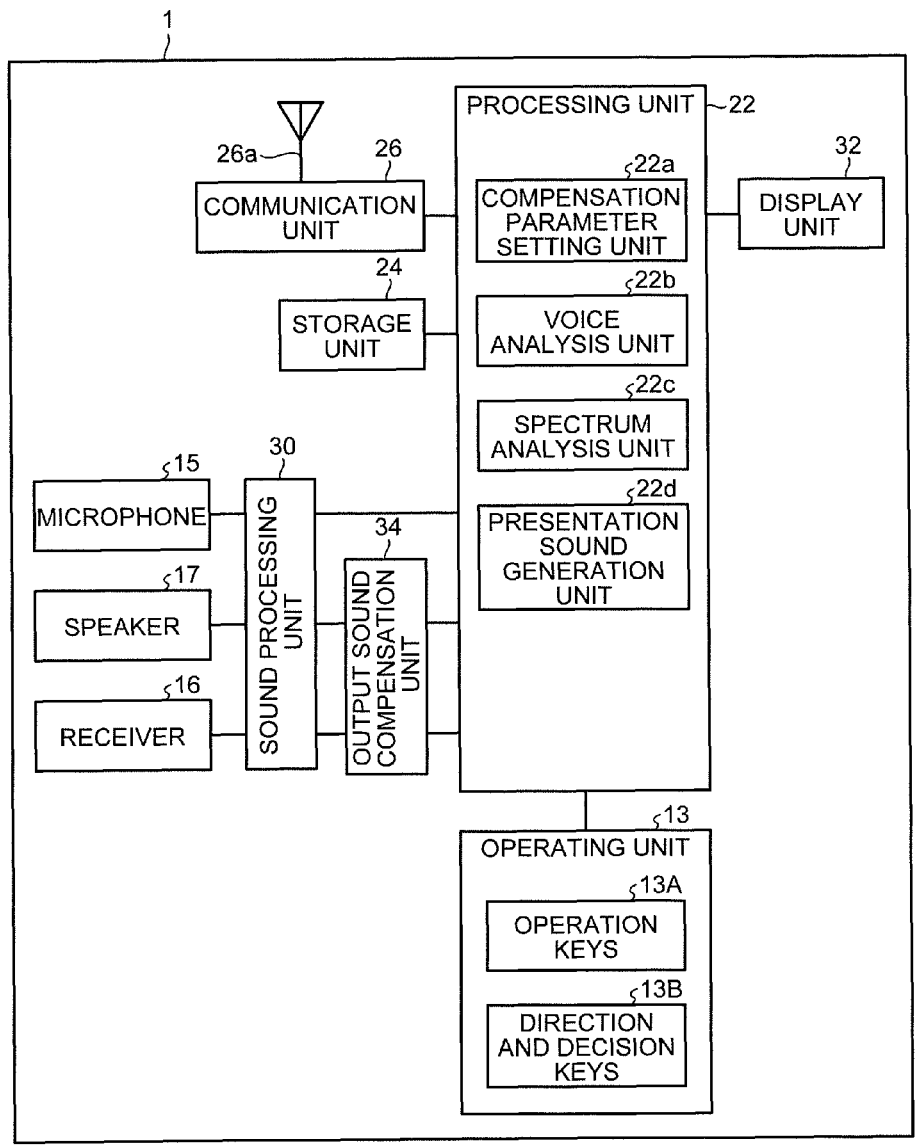
FIG. 3 is a block diagram schematically illustrating functions of the mobile electronic device illustrated in FIGS. 1 and 2.

FIG. 3 is a block diagram schematically illustrating functions of the mobile electronic device illustrated in FIGS. 1 and 2. As illustrated in FIG. 3, the mobile phone 1 includes a processing unit 22, a storage unit 24, a communication unit 26, the operating unit 13, a sound processing unit 30, a display unit 32, and a sound compensation unit 34. The processing unit 22 has a function of integrally controlling entire operations of the mobile electronic device 1. That is, the processing unit 22 controls operations of the communication unit 26, the sound processing unit 30, the display unit 32 and the like so that respective types of processing of the mobile electronic device 1 are performed in adequate procedures according to operations for the operating unit 13 and software stored in the storage unit 24 of the mobile electronic device 1.

The respective types of processing of the mobile electronic device 1 include, for example, a voice call performed over a circuit switched network, composing, transmitting and receiving an email, and browsing of a Web (World Wide Web) site on the Internet. The operations of the communication unit 26, the sound processing unit 30, the display unit 32 and the like include, for example, transmitting and receiving of a signal by the communication unit 26, input and output of sound by the sound processing unit 30, and displaying of an image by the display unit 32.

The processing unit 22 performs processing based on a program (for example, an operating system program, an application program or the like) stored in the storage unit 24. The processing unit 22 includes an MPU (Micro Processing Unit), for example, and performs the above described respective types of processing of the mobile electronic device 1 according to the procedure instructed by the software. That is, the processing unit 22 performs the processing by successively reading instruction codes from the operating system program, the application program or the like which is stored in the storage unit 24.

The processing unit 22 has a function of executing a plurality of application programs. The application programs executed by the processing unit 22 include a plurality of application programs, for example, an application program for reading and decoding various image files (image information) from the storage unit 24, and an application program for displaying an image obtained by decoding.

In the embodiment, a processing unit 22 includes a compensation parameter setting unit 22a which sets a compensation parameter in an output sound compensation unit 34, a voice analysis unit 22b which performs voice recognition, a spectrum analysis unit 22c which performs spectrum analysis on voice, and a presentation sound generation unit 22d which generates a predetermined presentation sound (test sound). The respective functions of the compensation parameter setting unit 22a, the voice analysis unit 22b, the spectrum analysis unit 22c, and the presentation sound generation unit 22d are realized by hardware resources including the processing unit 22 and a storage unit 24 which perform the tasks allocated by a control unit of the processing unit 22. The task refers to a unit of processing which cannot be performed simultaneously among the whole processing performed by application software or processing performed by the same application software. The functions of the compensation parameter setting unit 22a, the voice analysis unit 22b, the spectrum analysis unit 22c, and the presentation sound generation unit 22d may be performed by a server which can communicate with a mobile electronic device 1 via a communication unit 26 so that the server transmits the result to the mobile electronic device 1.

The storage unit 24 stores software and data to be used for processing in the processing unit 22 and tasks for starting the above described image processing program. Other than these tasks, the storage unit 24 stores, for example, communicated and downloaded sound data, or software used by the processing unit 22 in controlling the storage unit 22, an address book in which telephone numbers, email address and the like of the contacts are described for management, sound files including a dial tone and a ring tone, and temporally data and the like to be used in software processing.

A computer program and temporary data to be used in software processing are temporally stored in a work area allocated to the storage unit 24 by the processing unit 22. The storage unit 24 includes, for example, a nonvolatile storage device (a nonvolatile semiconductor memory such as a ROM (Read Only Memory), a hard disk device or the like), a readable and writable storage device (for example, SRAM (Static Random Access Memory), DRAM (Dynamic Random Access Memory) or the like.

The communication unit 26 has an antenna 26a and establishes a wireless signal path using a code division multiple access (CDMA) system, or any other wireless communication protocols, with a base station via a channel allocated by the base station, and performs telephone communication and information communication with the base station. The operating unit 13 includes operation keys 13A and direction and decision keys 13B to which respective functions are allocated including a power source key, a call key, numeric keys, character keys, direction keys, a confirm key, and a launch call key. When the user operates these keys for input, a signal corresponding to the user's operation is generated. The generated signal is input to the processing unit 22 as the user's instruction.

The sound processing unit 30 processes a sound signal input to the microphone 15 and a sound signal output from the receiver 16 or the speaker 17. That is, the sound processing unit 30 amplifies sound input from the microphone 15, performs AD conversion (Analog-to-Digital conversion) on it, and then further performs signal processing such as encoding or the like to convert it to digital sound data, and outputs the data to the processing unit 22. In addition, the sound processing unit 30 performs processing such as decoding, DA conversion (Digital-to-Analog conversion), amplification on signal data sent via the output sound compensation unit 34 from the processing unit 22 to convert it to an analog sound signal, and outputs the signal to the receiver 16 or the speaker 17. The speaker 17, which is placed in the housing 1C of the mobile electronic device 1, outputs the ring tone, an email sent notification sound or the like.

The display unit 32, which has the above described display 2, displays a video according to video data and an image according to image data supplied from the processing unit 22. The display 2 includes, for example, an LCD (Liquid Crystal Display) or an GELD (Organic Electro-Luminescence Display). The display unit 32 may have a sub-display in addition to the display 2.

The output sound compensation unit 34 performs compensation on sound data sent from the processing unit 22 based on a compensation parameter set by the processing unit 22 and outputs it to the sound processing unit 30. The compensation performed by the output sound compensation unit 34 is the compensation of amplifying the input sound data with a different gain according to the volume and the frequency based on a compensation parameter. The output sound compensation unit 34 may be implemented by a hardware circuit or by a CPU and a program. When the output sound compensation unit 34 is implemented by a CPU and a program, the output sound compensation unit 34 may be implemented inside the processing unit 22. The function of the output sound compensation unit 34 may be performed by a server which can communicate with the mobile electronic device 1 via the communication unit 26 so that the server transmits the sound data which is subjected to the compensation processing to the mobile electronic device 1.

Figure 4:
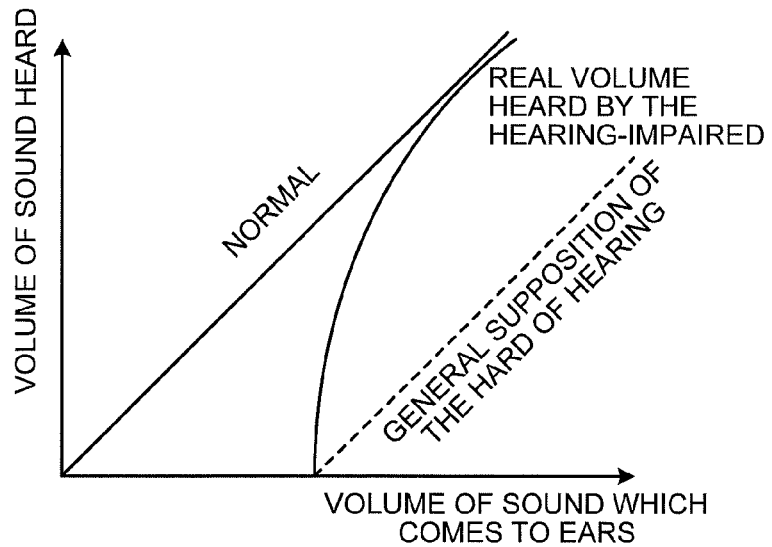
FIG. 4 is a diagram illustrating the characteristics of the human hearing ability.
Figure 5:
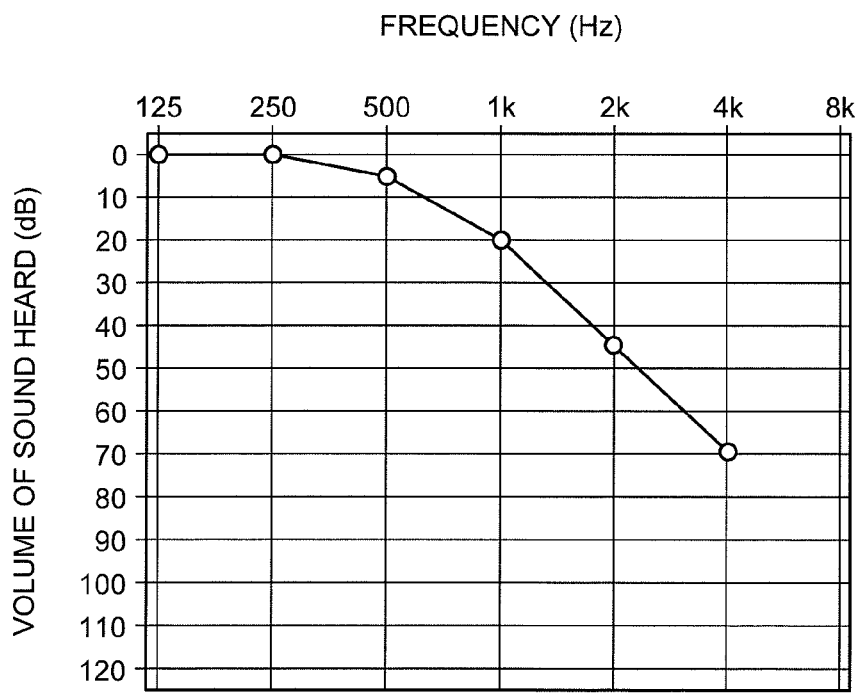
FIG. 5 is a diagram illustrating an example of the characteristics of the hearing ability of a hearing-impaired.

Then, the human hearing ability will be described with reference to FIGS. 4 to 9. FIG. 4 is a graph illustrating relationship between the volume of a sound which comes to human ears and the volume of a sound heard (sensed) by the human. For a person with normal hearing ability, the volume of a sound which comes to his/her ears and the volume of a sound heard by the person are in proportion to each other. On the other hand, it is generally supposed that the hearing-impaired (an aged person, a patient with ear disease, and the like) can hear almost nothing until the volume of a sound which comes to his/her ears reaches a certain value, and once the volume of a sound which comes to his/her ears is at the certain value or more, the person begins to hear the sound in proportion to the volume of the sound which comes to his/her ears. Therefore, it is generally considered that it is only needed to simply amplify the sound which comes to the ears of the hearing-impaired. However, in reality, the hearing-impaired can hear almost nothing until the volume of the sound which comes to his/her ears reaches a certain value, and once the volume of the sound which comes to his/her ears is at the certain value or more, the person suddenly begins to hear the sound as a loud sound. For that reason, the hearing-impaired may sense a change by 10 dB as a change by 20 dB in hearing, for example. Therefore, compression processing (processing of reducing the gain to a loud sound to be less than the gain to a small sound) needs to be performed on a loud sound. FIG. 5 is a graph illustrating the frequency characteristics of the hearing ability of the hearing-impaired. As illustrated in FIG. 5, the hearing-impaired can hear low-pitched sounds well and is harder to hear the sound as the sound becomes higher-pitched. The characteristics illustrated in FIG. 5 is merely an example and the frequency characteristics of sounds which can be heard differ for each user.

Figure 6:
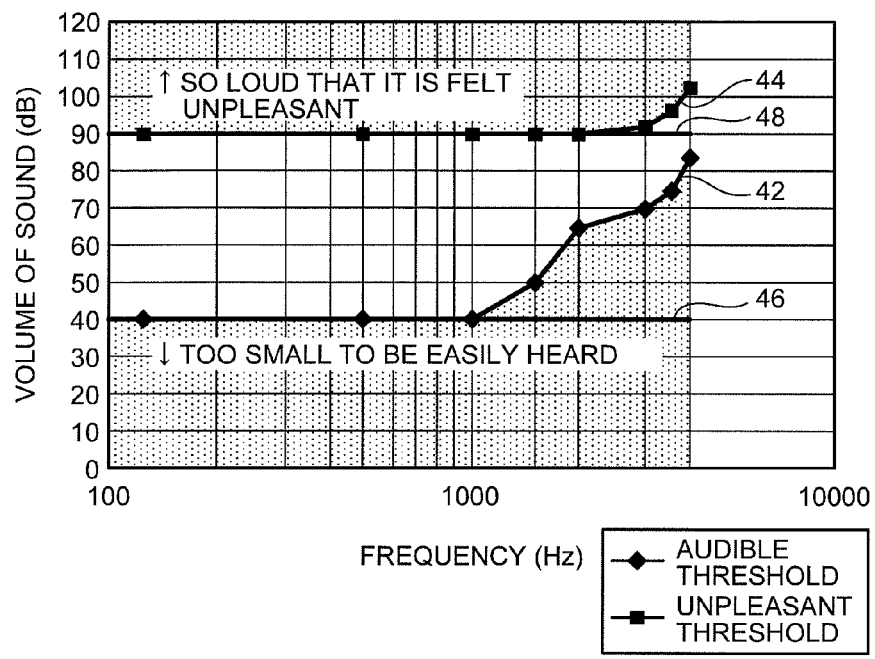
FIG. 6 is a diagram illustrating an example of an audible threshold and an unpleasant threshold of the hearing-impaired.

FIG. 6 is a diagram illustrating an example of relationship between the volume of output sound and an audible threshold and an unpleasant threshold for a person with normal hearing ability and the hearing-impaired. The audible threshold refers to the minimum volume of sound which can be heard appropriately, for example, the sound which can be heard at 40 dB. Sound of the volume less than the audible threshold is sound too small to be easily heard. The unpleasant threshold refers to the maximum volume of sound which can be heard appropriately, for example, the sound which can be heard at 90 dB. Sound of the volume more than the unpleasant threshold is sound so loud that it is felt unpleasant. As illustrated in FIG. 6, for the hearing-impaired, both an audible threshold 42 and an unpleasant threshold 44 increase as the frequency increases. On the other hand, for a person with normal hearing ability, both the audible threshold 46 and the unpleasant threshold 48 are constant with respect to the volume of the output sound.

Figure 7:
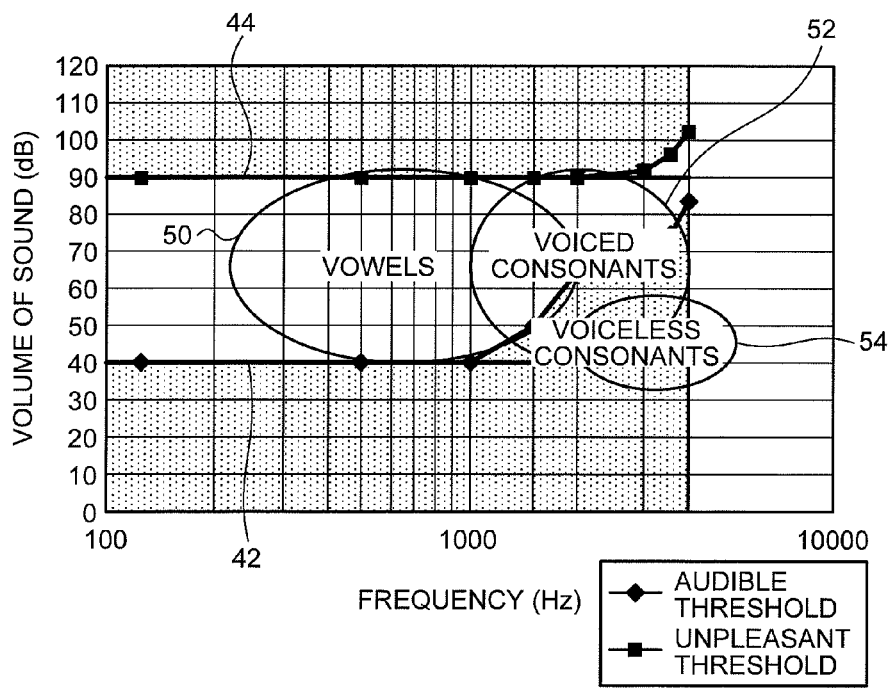
FIG. 7 is a diagram superimposing the volume and the frequencies of vowels, voiced consonants, and voiceless consonants on FIG. 6.

FIG. 7 is a diagram superimposing the volume and the frequencies of vowels, voiced consonants, and voiceless consonants which are output without adjustment on the relationship between the volume of output sound and the audible threshold and the unpleasant threshold for the hearing-impaired. As illustrated in FIG. 7, it can be understood that when the sound to be output is not adjusted, i.e., when the sound is output in the same state as that for the person with normal hearing, the hearing-impaired can hear the vowels but almost nothing of the consonants (voiced consonants, voiceless consonants). Specifically, the hearing-impaired can hear part of the voiced consonants but almost nothing of the voiceless consonants.

FIG. 7 is a diagram superimposing the volume and the frequencies of vowels, voiced consonants, and voiceless consonants which are output without adjustment on the relationship between the volume of output sound and the audible threshold and the unpleasant threshold for the hearing-impaired. As illustrated in FIG. 7, the vowels output without adjustment, i.e., the vowels output in the same state as that used for the person with normal hearing are output as the sound of the frequency and the volume in a range surrounded by a range 50. Similarly, the voiced consonants are output as the sound of the frequency and the volume in a range surrounded by a range 52, and the voiceless consonants are output as the sound of the frequency and the volume in a range surrounded by a range 54. Here, as illustrated in FIG. 7, the range 50 of vowels and part of the range 52 of voiced consonants are included in the range of the sounds heard by the hearing-impaired, between the audible threshold 42 and the unpleasant threshold 44, but the rest of the range 52 of voiced consonants and the whole range 54 of the voiceless consonants are not included therein. Therefore, it can be understood that when the sound is output as the same output as that for the person with normal hearing, the hearing-impaired can hear the vowels but almost nothing of the consonants (voiced consonants, voiceless consonants). Specifically, the hearing-impaired can hear part of the voiced consonants but almost nothing of the voiceless consonants.

Figure 8:
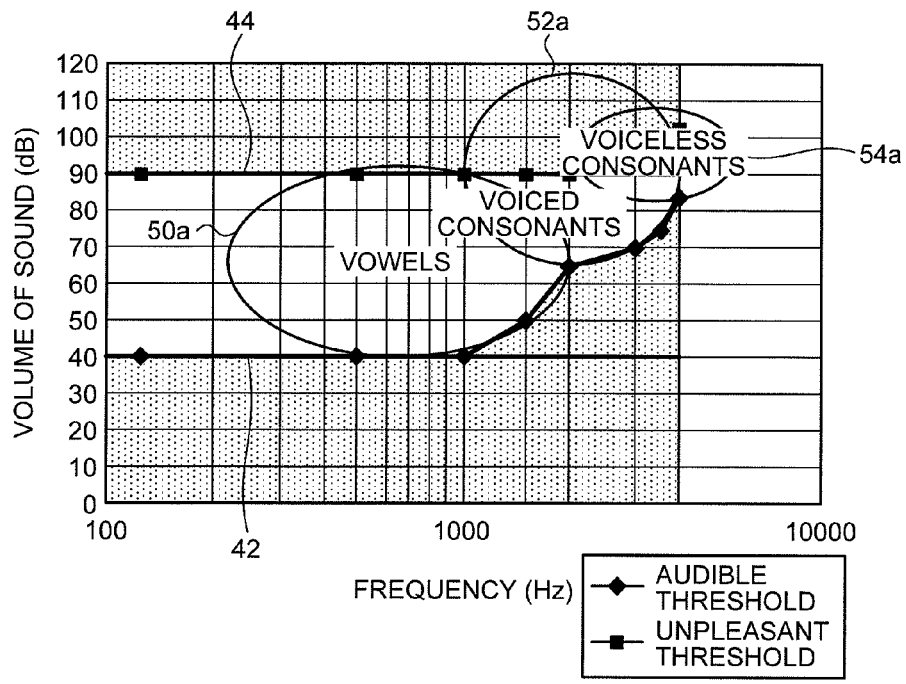
FIG. 8 is a diagram simply amplifying the high-pitched sounds (consonants) illustrated in FIG. 7.

FIG. 8 is a diagram simply amplifying the high-pitched tones (consonants) illustrated in FIG. 7. A range 50a of vowels illustrated in FIG. 8 is the same as the range 50 of vowels illustrated in FIG. 7. A range 52a of voiced consonants is set in the direction of louder volume from the range 52 of voiced consonants illustrated in FIG. 7 as a whole, i.e., the range 52a is set upward in FIG. 8 from the range 52 in FIG. 7. A range 54a of voiceless consonants is also set in the direction of louder volume from the range 54 of voiceless consonants illustrated in FIG. 7 as a whole, i.e., the range 54a is set upward in FIG. 8 from the range 54 in FIG. 7. As illustrated in FIG. 8, when the sound in the frequency domain which is difficult to be heard is simply amplified, i.e., the sound in the range 52a of voiced consonants and in the rage 54a of voiceless consonants is simply amplified, the louder volume parts of the ranges exceed the unpleasant threshold 44, and as a result, the high-pitch sound is heard as shrieked sound. That is, the sound is heard distorted and the words cannot be heard clearly.

Figure 9:
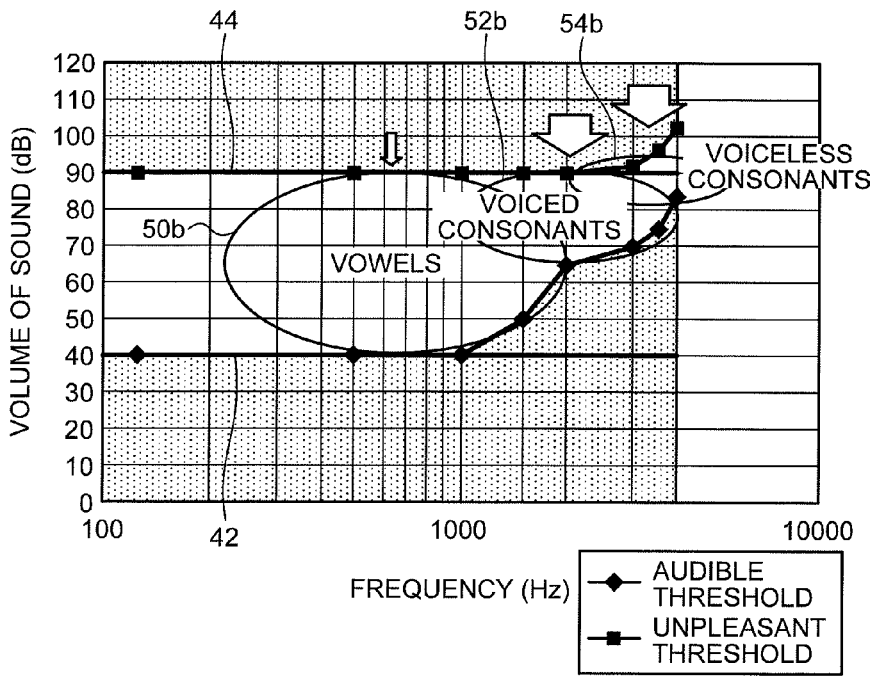
FIG. 9 is a diagram compressing sounds of loud volume illustrated in FIG. 8.

Contrarily, FIG. 9 is a diagram compensating the sounds by the sound compensation unit 34 of the mobile electronic device 1 according to the embodiment, specifically a diagram performing compression processing (processing of reducing the gain to loud sound below the gain to small sound) on the loud sound of FIG. 8. A range 50b of vowels illustrated in FIG. 9 has the gain to loud sound reduced smaller than that in the range 50a of vowels illustrated in FIG. 8. A range 52b of voiced consonants has the gain to loud sound reduced smaller than that in the range 52a of voiced consonants illustrated in FIG. 8. A range 54b of voiceless consonants has the gain to loud sound reduced smaller than that in the range 54a of voiceless consonants illustrated in FIG. 8. As illustrated in FIG. 9, the small sound is amplified by a big gain and the loud sound is amplified by a small gain so that the range 50b of vowels, the range 52b of voiced consonants, and the range 54b of voiceless consonants can be included in a comfortable volume range (between the audible threshold 42 and the unpleasant threshold 44). The mobile electronic device 1 decides a compensation parameter for input sound data by taking the above described things into consideration. The compensation parameter is a parameter for compensating input sound so that the sound can be heard by the user as the sound of volume between the audible threshold 42 and the unpleasant threshold 44. The mobile electronic device 1 performs compensation by amplifying the sound by a gain according to the volume and the frequency with the decided compensation parameter by the sound compensation unit 34, and outputs it to the sound processing unit 30. Accordingly, the mobile electronic device 1 can enable the hard of hearing user to hear the sound preferably.

The operation of the mobile electronic device according to Embodiment 1 will be described with reference to FIGS. 10 to 19B, and then, the operation of the mobile electronic device according to Embodiment 2 will be described with reference to FIGS. 20 to 24, below.

[Embodiment 1]

Figure 10:
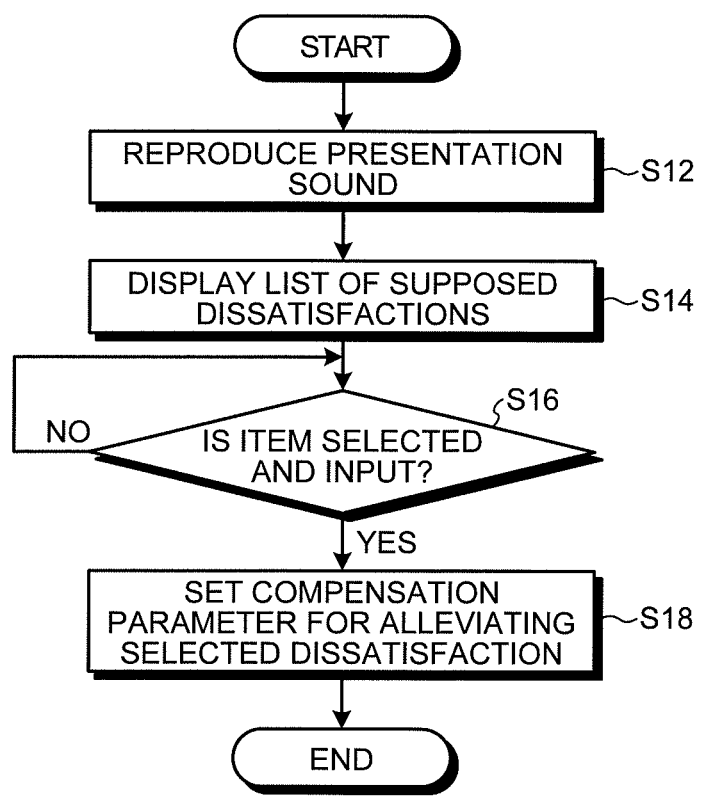
FIG. 10 is a flowchart for describing an exemplary operation of the mobile electronic device according to Embodiment 1.

An example of a compensation parameter setting operation of the mobile electronic device according to Embodiment 1 will be described with reference to FIG. 10. FIG. 10 is a flowchart describing an exemplary operation of the mobile electronic device according to Embodiment 1. The operation described in FIG. 10 may be processed by executing an application stored in the storage unit 24. The program may be obtained by downloading from an external source. The operation described in FIG. 10 may be performed by a server which can communicate with the mobile electronic device 1 via the communication unit 26, so that the server transmits the sound, the image and the like to the mobile electronic device 1, which performs actions such as outputting and displaying of the sound, the image and the like received from the server, and when the user inputs data to the mobile electronic device 1, the mobile electronic device 1 transmits the input data to the server.

Figure 11A:
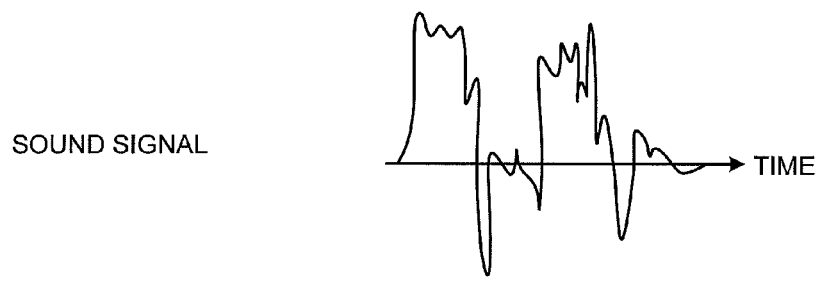
FIG. 11A is a diagram illustrating a sound signal of a sound which is slightly smaller than an unpleasant threshold.
Figure 11B:
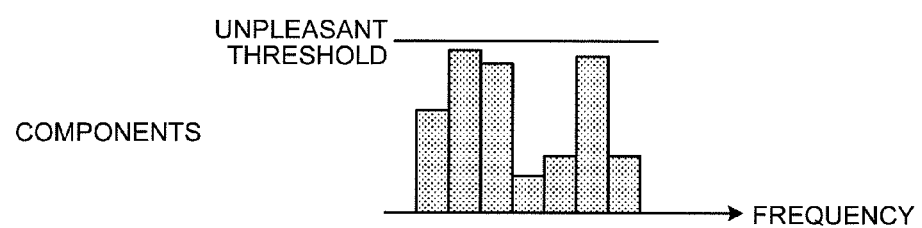
FIG. 11B is a diagram illustrating spectral components of the sound signal illustrated in FIG. 11A.
Figure 11C:
FIG. 11C is a diagram illustrating a sound signal of a sound which is slightly louder than an audible threshold.
Figure 11D:
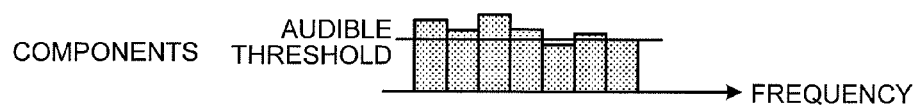
FIG. 11D is a diagram illustrating spectral components of the sound signal illustrated in FIG. 11C.

First of all, the processing unit 22 of the mobile electronic device 1 reproduces a presentation sound (test sound) at Step S12. That is, the processing unit 22 of the mobile electronic device 1 generates a presentation sound (test sound) by the presentation sound generation unit 22d, and outputs the presentation sound from a receiver 16 or a speaker 17 via a sound processing unit 30. Since the sound close to the unpleasant threshold and the sound close to the audible threshold largely affect hearing, the sound barely below the unpleasant threshold which is set for the person with normal hearing ability (for example, a sound slightly smaller than the unpleasant threshold) and the sound barely above the audible threshold which is set for the person with normal hearing ability (for example, a sound slightly louder than the audible threshold) are preferably used as the presentation sound for the initial presentation. From the second presentation, the sound barely below the unpleasant threshold and the sound barely above the audible threshold set for each user are preferably used. FIG. 11A is a diagram illustrating a sound signal of a sound which is slightly smaller than the set unpleasant threshold. FIG. 11B is a diagram illustrating spectral components of the sum of the sound signals illustrated in FIG. 11A. FIG. 11C is a diagram illustrating a sound signal of a sound which is slightly louder than the set unpleasant threshold. FIG. 11D is a diagram illustrating spectral components of the sum of the sound signals illustrated in FIG. 11C.

Figure 12A:
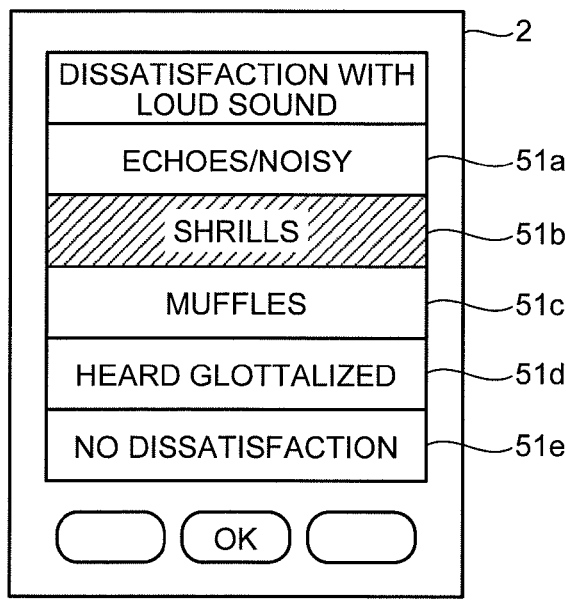
FIG. 12A is a diagram illustrating dissatisfactions with the sound listed on a display when a loud sound is reproduced as a presentation sound.
Figure 12B:
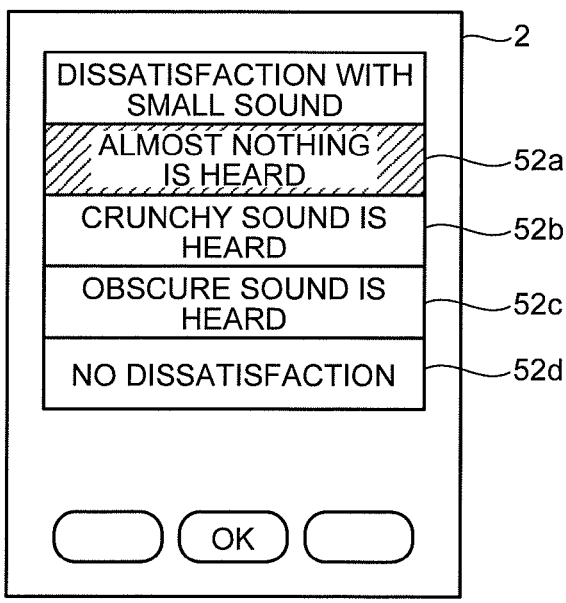
FIG. 12B is a diagram illustrating dissatisfactions with the sound listed on a display when a small sound is reproduced as a presentation sound.

Returning to FIG. 10, subsequently at Step S14, the processing unit 22 displays on the display 2 a list of dissatisfactions (demands) with the sound which the user is supposed to have. FIG. 12A is a diagram illustrating dissatisfactions with the sound listed on the display 2 when a loud sound (a sound slightly smaller than the unpleasant threshold) is reproduced as the presentation sound. FIG. 12B is a diagram illustrating dissatisfactions with the sound listed on the display 2 when a small sound (a sound slightly louder than the audible threshold) is reproduced as the presentation sound. Referring to FIG. 12A, when a loud sound (a sound slightly smaller than the unpleasant threshold) is reproduced as the presentation sound, an item 51*a* "echoes/noisy", an item 51*b* "shrills", an item 51*c* "muffles", an item 51*d* "heard glottalized", and an item 51*e* "no dissatisfaction" are listed on the display 2. Referring to FIG. 12B, when a small sound (a sound slightly louder than the audible threshold) is reproduced as the presentation sound, an item 52*a* "almost nothing is heard", an item 52*b* "a crunchy sound is heard", an item 52*c* "an obscure sound is heard", an item 52*d* "no dissatisfaction" are listed on the display 2.

Returning to FIG. 10, subsequently at Step S16, the processing unit 22 determines whether any of the items listed on the display 2 is selected. When it is determined that none of the items listed on the display 2 is selected (No at Step S16), then the processing standbys at Step S16.

When it is determined that an item is selected from the items listed on the display 2 (Yes at Step S16), then at Step S18, the processing unit 22 sets a compensation parameter for alleviating the selected dissatisfaction (fulfilling the demand) to the output sound compensation unit 34 by the compensation parameter setting unit 22*a*. For example, when the processing unit 22 reproduces the presentation sound illustrated in FIG. 11A (the sound slightly smaller than the unpleasant threshold) and the item 51*b* "shrills" is selected as illustrated in FIG. 12A, it is understood that the loud high-pitched sound exceeds the unpleasant threshold for the user, then, the processing unit 22 sets a compensation parameter for decreasing the gain for the loud high-pitched sound to the output sound compensation unit 34 by the compensation parameter setting unit 22*a*. For example, when the processing unit 22 reproduces the presentation sound illustrated in FIG. 11C (the sound slightly louder than the audible threshold) and the item 52*a* "almost nothing is heard" is selected as illustrated in FIG. 12B, it is understood that the sound falls short of the audible threshold as a whole (across the whole frequency bands) for the user, then, the processing unit 22 sets a compensation parameter for increasing the gain for the small sound across the whole frequency bands to the output sound compensation unit 34 by the compensation parameter setting unit 22*a*. The compensation parameter may be the gain or may be a control value for controlling the output sound compensation unit 34 to amplify the sound with a desired gain. The compensation parameter setting unit 22*a* of the processing unit 22 repeats the operation of setting (adjusting) the compensation parameter for each frequency based on relationship, as described above, between the presentation sound which is output and the response input by the user with respect to the presented sound.

Accordingly, the compensation parameter which suits the user's hearing (what is heard by the user as the sound, the characteristics of the user's hearing ability) can be set and the sound which is more easily heard by the user can be output.

By repeatedly performing the flow described in FIG. 10 with various presentation sounds, the processing unit 22 can converge the compensation parameter to the value suitable for the user to output the sound which can be more easily heard by the user. Also by regularly (for example, every three months, every six months, or the like) performing the flow described in FIG. 10, the processing unit 22 can output the sound which can be more easily heard by the user even if the user's hearing ability has changed.

When it is determined at Step S16 that an item is selected from the items listed on the display 2 (Yes at Step S16), the processing unit 22 may record the selected item as a log in the storage unit 24 so that the log is displayed on the display unit 32 according to an instruction input by the user. Accordingly, the user can recognize items selected in the past, and thus, a process of adjusting the compensation parameters by referring to the log. That allows the user to adjust the compensation parameter more easily.

Figure 13:
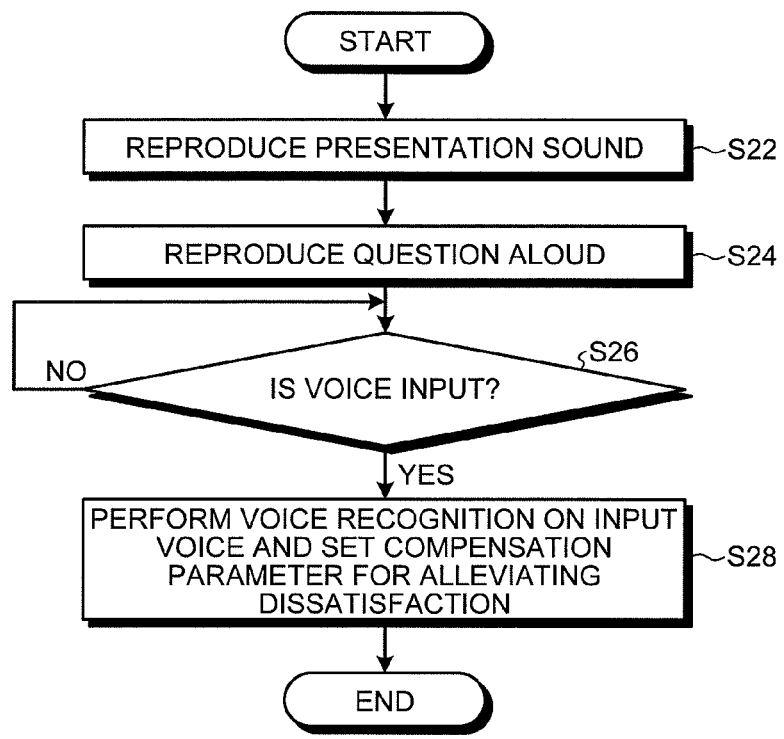
FIG. 13 is a flowchart for describing an exemplary operation of the mobile electronic device according to Embodiment 1.

An example of a compensation parameter setting operation of the mobile electronic device according to Embodiment 1 will be described with reference to FIG. 13. FIG. 13 is a flowchart describing an exemplary operation of the mobile electronic device according to Embodiment 1. The operation described in FIG. 13 may be processed by executing an application stored in the storage unit 24. The program may be obtained by downloading from an external source. The operation described in FIG. 13 may be performed by a server which can communicate with the mobile electronic device 1 via the communication unit 26, so that the server transmits the sound, the image and the like to the mobile electronic device 1, which performs actions such as outputting and displaying of the sound, the image and the like received from the server, and when the user inputs data to the mobile electronic device 1, the mobile electronic device 1 transmits the input data to the server.

First of all, the processing unit 22 of the mobile electronic device 1 reproduces the presentation sound (test sound) at Step S22. Since the sound close to the unpleasant threshold and the sound close to the audible threshold largely affect hearing, the sound barely below the unpleasant threshold (a sound slightly smaller than the unpleasant threshold) and the sound barely above the audible threshold (a sound slightly louder than the audible threshold) are preferably used as the presentation sound.

Figure 14:
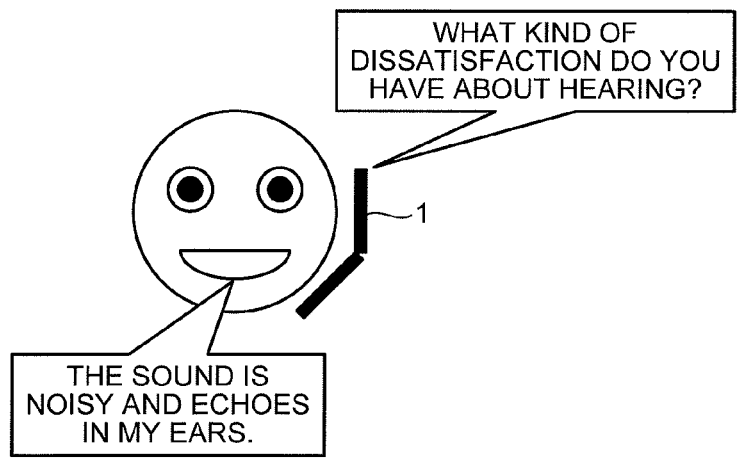
FIG. 14 is a diagram illustrating a case where the mobile electronic device reproduces a question aloud asking a user about dissatisfaction with the sound.

Subsequently at Step S24, from the receiver 16 or the speaker 17, the processing unit 22 reproduces a question aloud asking the user about dissatisfaction (demand) with the sound. FIG. 14 is a diagram illustrating a case where the mobile electronic device 1 reproduces a question aloud asking the user about dissatisfaction with the sound. The processing unit 22 reproduces, for example, a question aloud asking "What kind of dissatisfaction do you have about hearing?" from the receiver 16 or the speaker 17 as illustrated in FIG. 14.

Subsequently at Step S26, the processing unit 22 determines whether an answer to the question (dissatisfaction with the sound) is input by the microphone 15. When it is determined that no voice expressing dissatisfaction with the sound is input (No at Step S26), then the processing unit 22 makes the processing standby at Step S26.

When it is determined that voice expressing dissatisfaction with the sound is input by the microphone 15 (Yes at Step S26), then at Step S28, the processing unit 22 analyzes the input voice by the voice analysis unit 22*b*, and sets a compensation parameter for alleviating the dissatisfaction of the user (fulfilling the demand) to the output sound compensation unit 34 by the compensation parameter setting unit 22*a*. For example, when the voice "the sound is noisy and echoes in my ears" is input as illustrated in FIG. 14, the processing unit 22 detects keywords "noisy" and "echoes" by the voice analysis unit 22*b* and sets a compensation parameter for decreasing the gain for the whole of the loud sound to the output sound compensation unit 34 by the compensation parameter setting unit 22*a*.

That enables even a user who is unfamiliar with operation by using the operating unit 13 to set a compensation parameter which suits the user only by saying the dissatisfaction with the sound, and thus, output the sound which can be more easily heard by the user.

When it is determined at Step S26 that voice expressing dissatisfaction with the sound is input by the microphone 15 (Yes at Step S26), the processing unit 22 may record the input voice or keywords as a log in the storage unit 24 so that the log is output from the receiver 16 or the speaker 17 or displayed on the display unit 32 according to an instruction input by the user. Accordingly, the user can recognize voice or keywords input in the past, and thus, a process of adjusting the compensation parameters by referring to the log. That allows the user to adjust the compensation parameter more easily.

Figure 15:
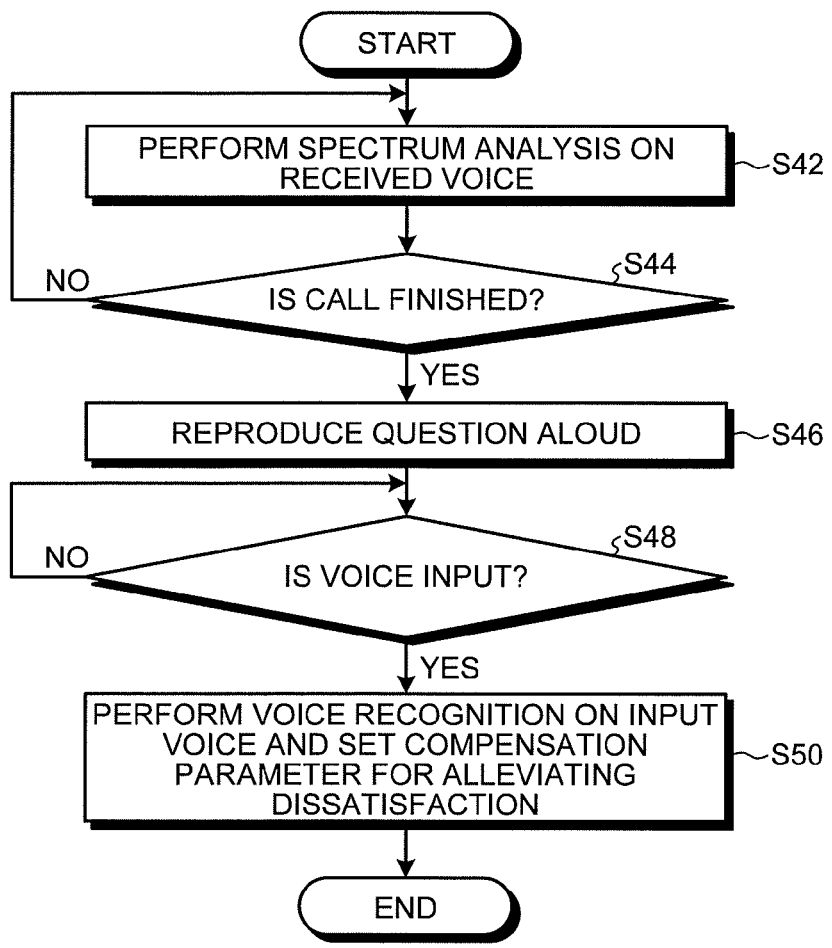
FIG. 15 is a flowchart for describing an exemplary operation of the mobile electronic device according to Embodiment 1.

An example of a compensation parameter setting operation of the mobile electronic device according to Embodiment 1 will be described with reference to FIG. 15. FIG. 15 is a flowchart describing an exemplary operation of the mobile electronic device according to Embodiment 1. The operation described in FIG. 15 is performed when a call starts. The operation described in FIG. 15 may be processed by executing an application stored in the storage unit 24. The program may be obtained by downloading from an external source. The operation described in FIG. 15 may be performed by a server which can communicate with the mobile electronic device 1 via the communication unit 26, so that the server transmits the sound, the image and the like to the mobile electronic device 1, which performs actions such as outputting and displaying of the sound, the image and the like received from the server, and when the user inputs data to the mobile electronic device 1, the mobile electronic device 1 transmits the input data to the server.

Figure 16A:
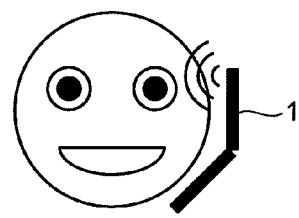
FIG. 16A is a diagram illustrating the mobile electronic device producing a received voice to a user.
Figure 16B:
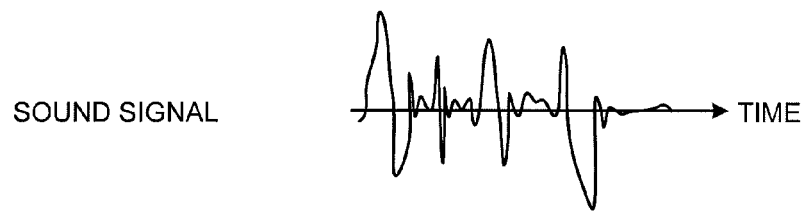
FIG. 16B is a diagram illustrating a sound signal of a received voice.
Figure 16C:
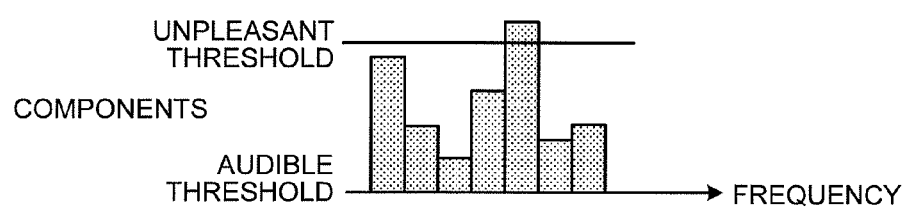
FIG. 16C is a diagram illustrating spectral components of the sound signal illustrated in FIG. 16B.

First of all, the processing unit 22 of the mobile electronic device 1 performs spectrum analysis on a received voice by the spectrum analysis unit 22c and stores the result in the storage unit 24 at Step S42. FIG. 16A is a diagram illustrating the mobile electronic device 1 producing a received voice to the user. FIG. 16B is a diagram illustrating an example of a sound signal of a received voice. FIG. 16C is a diagram illustrating spectral components of the sum of the sound signals illustrated in FIG. 16B.

Since the sound coding system such as CELP (code-excited linear predictive coding), EVRC (enhanced variable rate codec), and AMR (adaptive multi-rate) is performed in the mobile phone communication, the sound quality of the received voice may differ from that of a human voice. Subsequently at Step S44, the processing unit 22 determines whether the call is finished. When it is determined that the call is not finished yet (No at Step S44), the processing unit 22 proceeds the processing to Step S42.

When it is determined that the call is finished (Yes at Step S44), then at Step S46, the processing unit 22 reproduces a question aloud asking the user about dissatisfaction (demand) with the sound from the receiver 16 or the speaker 17. The processing unit 22 reproduces, for example, a question aloud asking "what kind of dissatisfaction do you have about hearing?" from the receiver 16 or the speaker 17.

Subsequently at Step S48, the processing unit 22 determines whether an answer to the question (dissatisfaction with the sound) is input from the microphone 15. When it is determined that no voice expressing dissatisfaction with the sound is input (No at Step S48), then the processing unit 22 makes the processing standby at Step S48.

Figure 16D:
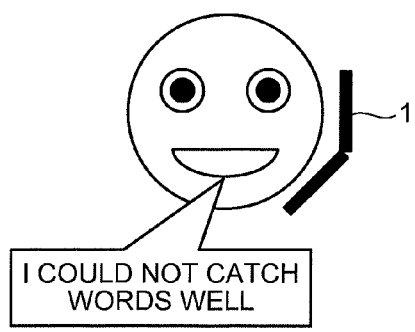
FIG. 16D is a diagram illustrating the user voicing dissatisfaction with the sound.

When it is determined that voice expressing dissatisfaction with the sound is input by the microphone 15 (Yes at Step S48), then at Step S50, the processing unit 22 analyzes the input voice by the voice analysis unit 22b, and sets a compensation parameter for alleviating the dissatisfaction of the user to the output sound compensation unit 34 by using the result of the spectrum analysis performed on the received voice by the compensation parameter setting unit 22a. FIG. 16D is a diagram illustrating the user voicing the user's dissatisfaction with the sound. For example, when the voice "I could not catch words well" is input as illustrated in FIG. 16D, the processing unit 22 sets a compensation parameter for increasing the gain for the frequency band of the small spectral component to the output sound compensation unit 34 by the compensation parameter setting unit 22a.

Accordingly, the compensation parameter can be set based on the actual received voice, and thus, the sound which can be more easily heard by the user can be output. Since the compensation parameter based on the actual received voice can be set even when the sound coding system such as CELP, EVRC, and AMR is performed on the received voice, the sound which can be more easily heard by the user can be output.

The processing unit 22 may record the result of the spectrum analysis performed at Step S42 on the received voice as a log in the storage unit 24. Further, upon receiving input of the user's voice at Step S48, the processing unit 22 may display the result of the spectrum analysis performed on the received voice on the display unit 32. That allows the user to adjust the compensation parameter more easily.

When it is determined that voice expressing dissatisfaction with the sound is input by the microphone 15 at Step S48 (Yes at Step S48), the processing unit 22 may record the input voice or keywords as a log in the storage unit 24 so that the log is output from the receiver 16 or the speaker 17 or displayed on the display unit 32 according to an instruction input by the user. Accordingly, the user can recognize the result of the spectrum analysis performed on the received voice in the past, voice or keywords input in the past, and thus, a process of adjusting the compensation parameters by referring to the log. That allows the user to adjust the compensation parameter more easily.

In a case where the processing described in FIG. 15 is performed in a server, the result of the spectrum analysis performed on the received voice and the result of adjusting the compensation parameter may be stored in the server as a log. Alternatively, the server may store sound data of conversations suitable for the test sound (for example, sound data of strong high range, sound data of strong low range, sound data covering from the low range to the high range) so that the server later transmits the sound data to the mobile electronic device 1 as the presentation sound to reproduce. With the sound data of conversations stored in the server side as described above, it is easier for the user to adjust the compensation parameter by using the sound data stored in the server side as the presentation sound, when the user buys a new mobile electronic device 1 (when the user replaces the mobile electronic device 1 with a new model).

Although it is assumed that the user inputs the dissatisfaction with the sound by voice here, dissatisfactions with the sound which the user supposed to have may be listed up for the user to select an item from the list.

Figure 17:
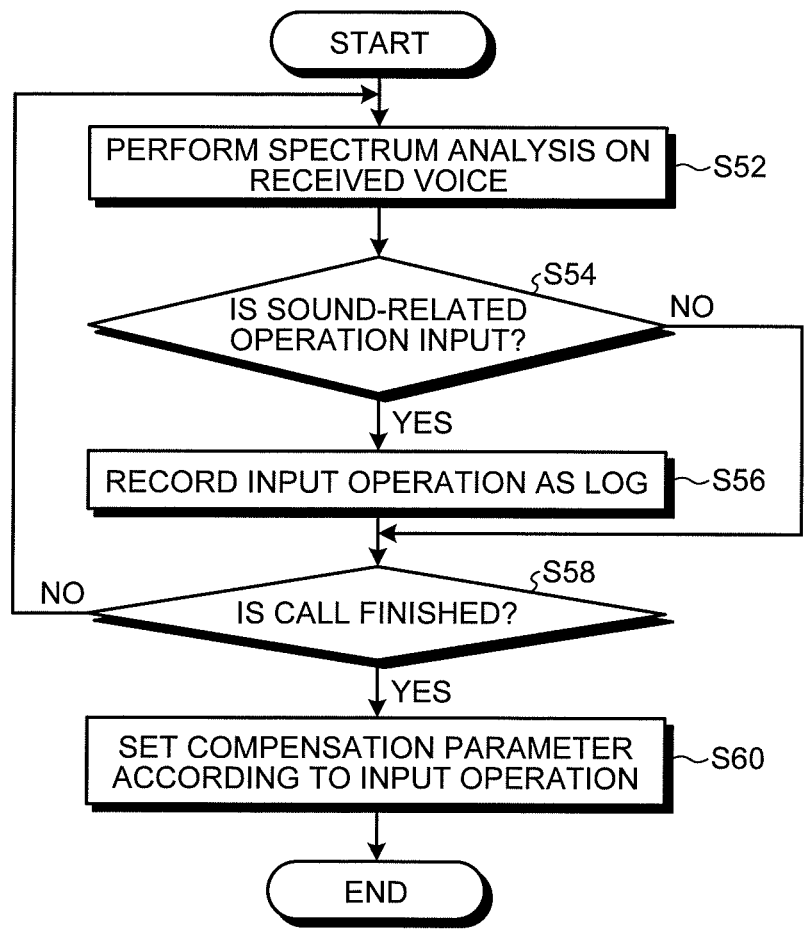
FIG. 17 is a flowchart for describing an exemplary operation of the mobile electronic device according to Embodiment 1.

An example of a compensation parameter setting operation of the mobile electronic device according to Embodiment 1 will be described with reference to FIG. 17. FIG. 17 is a flowchart describing an exemplary operation of the mobile electronic device according to Embodiment 1. The operation described in FIG. 17 is performed when a call starts. The operation described in FIG. 17 may be processed by executing an application stored in the storage unit 24. The program may be obtained by downloading from an external source. The operation described in FIG. 17 may be performed by a server which can communicate with the mobile electronic device 1 via the communication unit 26, so that the server transmits the sound, the image and the like to the mobile electronic device 1, which performs actions such as outputting and displaying of the sound, the image and the like received from the server, and when the user inputs data to the mobile electronic device 1, the mobile electronic device 1 transmits the input data to the server.

First of all, the processing unit 22 of the mobile electronic device 1 performs spectrum analysis on a received voice by the spectrum analysis unit 22c and stores the result in the storage unit 24 at Step S52. Subsequently at Step S54, the processing unit 22 determines whether an operation with respect to the sound (for example, volume adjustment, and sound quality adjustment) is input. When it is determined that an operation with respect to the sound is input (Yes at Step S54), then at Step S56, the processing unit 22 records the input operation in association with the result of the spectrum analysis as a log in the storage unit 24.

When it is determined that an operation with respect to the sound is not input (No at Step S54), or after Step S56 is executed, then at Step S56, the processing unit 22 determines whether the call is finished. When it is determined that the call is not finished yet (No at Step S58), the processing unit 22 proceeds the processing to Step S52.

When it is determined that the call is finished (Yes at Step S58), then at Step S60, the processing unit 22 sets the compensation parameter to the output sound compensation unit 34 based on the input operation and the result of the spectrum analysis. For example, if the operation to raise a volume is input during a call, the processing unit 22 sets the compensation parameter to increase the gain for the whole sound to the output sound compensation unit 34. Also, for example, if the operation of sound quality adjustment to strengthen the high-pitch sound is input during a call, the processing unit 22 sets the compensation parameter to increase the gain for the high-pitch sound to the output sound compensation unit 34.

Accordingly, the compensation parameter can be set based on the operation input during a call, and the compensation parameter can be set according to the actual received voice, and thus, the sound which can be more easily heard by the user can be output.

The processing unit 22 may record the result of the spectrum analysis performed at Step S52 on the received voice as a log in the storage unit 24. When it is determined that an operation with respect to the sound is input at Step S54 (Yes at Step S54), the processing unit 22 may record the input operation as a log in the storage unit 24 so that the log is displayed on the display unit 32 according to an instruction input by the user. Accordingly, the user can recognize the result of the spectrum analysis performed on the received voice in the past, the operations input in the past, and thus, a process of adjusting the compensation parameters by referring to the log.

Figure 18:
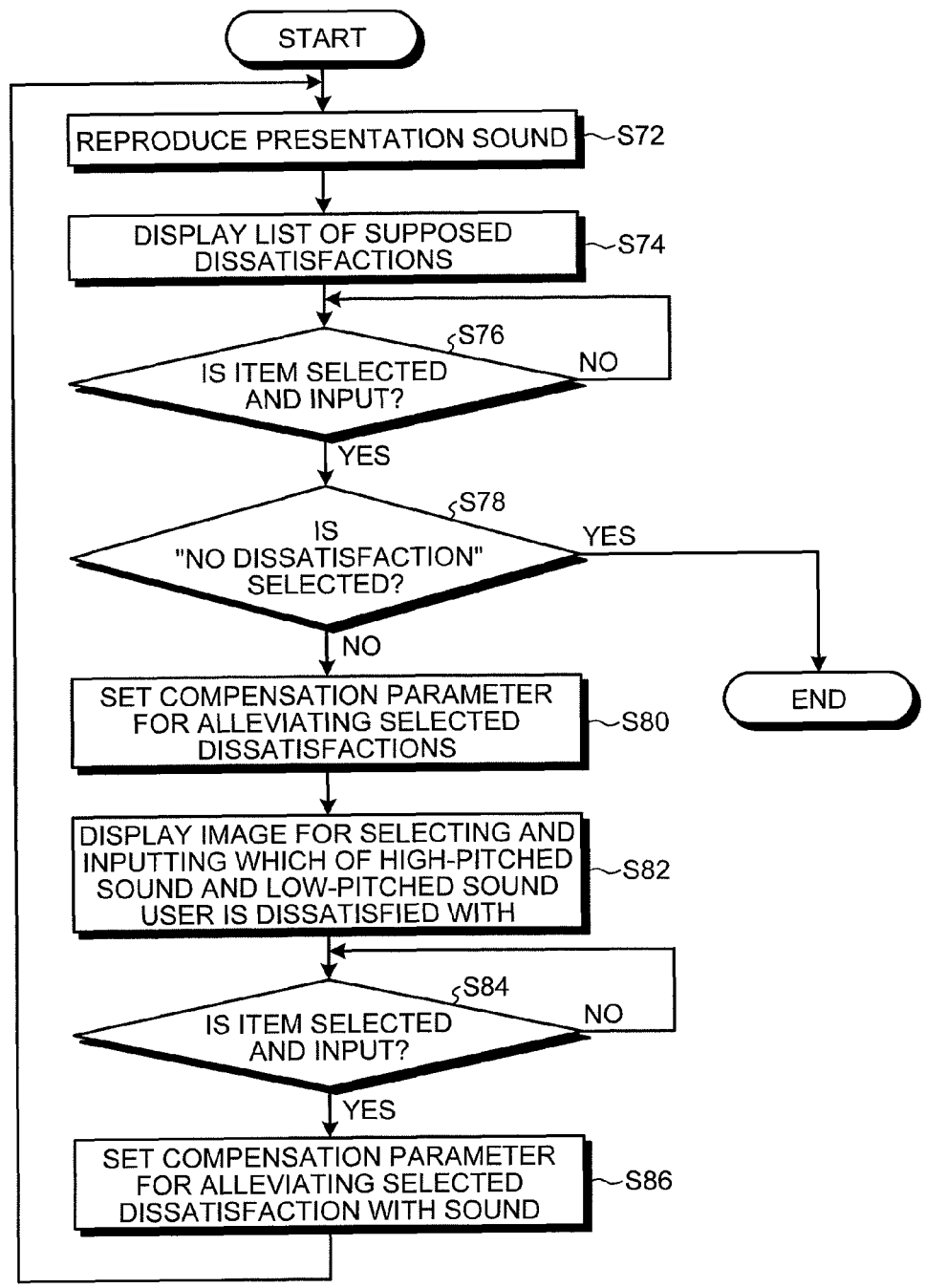
FIG. 18 is a flowchart describing an exemplary operation of the mobile electronic device according to Embodiment 1.

An example of a compensation parameter setting operation of the mobile electronic device according to Embodiment 1 will be described with reference to FIG. 18. FIG. 18 is a flowchart describing an exemplary operation of the mobile electronic device according to Embodiment 1. The operation described in FIG. 18 may be processed by executing an application stored in the storage unit 24. The program may be obtained by downloading from an external source. The operation described in FIG. 18 may be performed by a server which can communicate with the mobile electronic device 1 via the communication unit 26, so that the server transmits the sound, the image and the like to the mobile electronic device 1, which performs actions such as outputting and displaying of the sound, the image and the like received from the server, and when the user inputs data to the mobile electronic device 1, the mobile electronic device 1 transmits the input data to the server.

First of all, the processing unit 22 of the mobile electronic device 1 reproduces the presentation sound (test sound) by the presentation sound generation unit 22d at Step S72. Since the sound close to the unpleasant threshold and the sound close to the audible threshold largely affect hearing, the sound barely below the set unpleasant threshold (a sound slightly smaller than the unpleasant threshold) and the sound barely above the set audible threshold (a sound slightly louder than the audible threshold) are preferably used as the presentation sound.

Figure 19A:
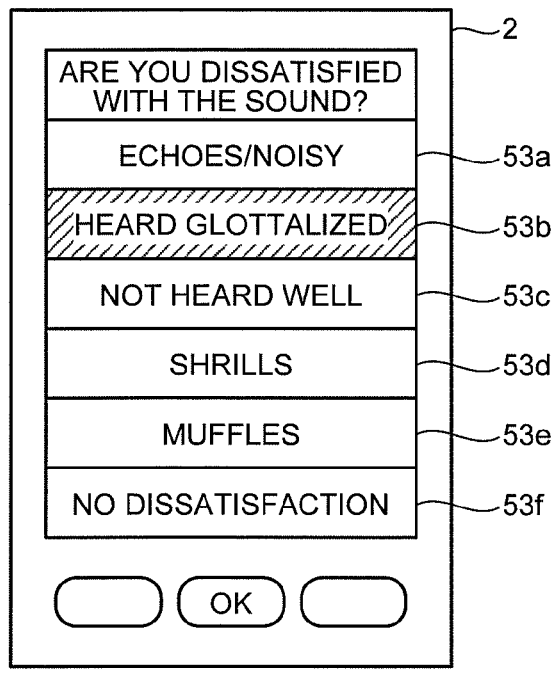
FIG. 19A is a diagram illustrating dissatisfactions with the sound listed on the display.

Subsequently at Step S74, the processing unit 22 lists up dissatisfactions (demands) with the sound which the user supposed to have on the display 2. FIG. 19A is a diagram illustrating an example of dissatisfactions with the sound listed on the display 2. Referring to FIG. 19A, an item 53a "echoes/noisy", an item 53b "heard glottalized", an item 53c "not heard well", an item 53d "shrills", an item 53e "muffles", and an item 53f "no dissatisfaction" are listed on the display 2.

Returning to FIG. 18, subsequently at Step S76, the processing unit 22 determines whether any of the items listed on the display 2 is selected. When it is determined that none of the items listed on the display 2 is selected (No at Step S76), then the processing unit 22 makes the processing standby at Step S76.

When it is determined that an item is selected from the items listed on the display 2 (Yes at Step S76), then at Step S78, the processing unit 22 determines whether the item 53f "no dissatisfaction" is selected. When it is determined that the item 53f "no dissatisfaction" is selected (Yes at Step S78), the processing unit 22 finishes the processing.

When it is determined that the item 53f "no dissatisfaction" is not selected (No at Step S78), then at Step S80, the processing unit 22 sets a compensation parameter for alleviating the selected dissatisfaction (fulfilling the demand) to the output sound compensation unit 34 by the compensation parameter setting unit 22a. For example, when the item 53b "heard glottalized" is selected as illustrated in FIG. 19A, it is understood that the volume of the high-pitched sound is too low for the user, then, the processing unit 22 sets a compensation parameter for increasing the gain for the high-pitched sound to the output sound compensation unit 34 by the compensation parameter setting unit 22a.

Figure 19B:
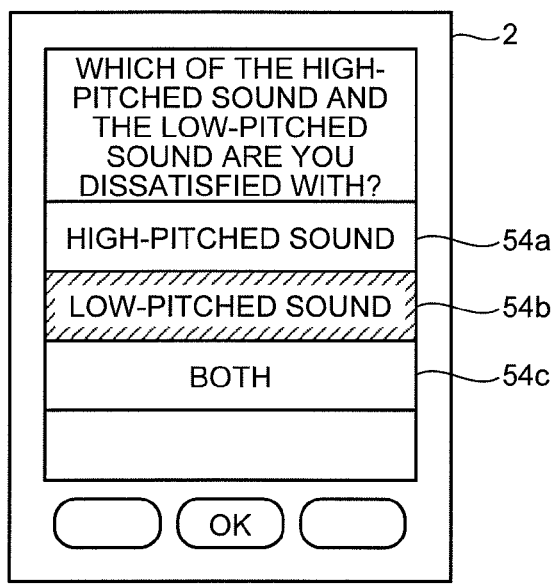

Subsequently at Step S82, the processing unit 22 displays on the display 2 an image for selecting and inputting which of the high-pitched sound and the low-pitched sound the user is dissatisfied with. FIG. 19B is a diagram illustrating an example of display 2 representing an image for selecting and inputting which of the high-pitched sound and the low-pitched sound the user is dissatisfied with. As illustrated in FIG. 19B, an item 54a "high-pitched sound", an item 54b "low-pitched sound", and an item 54c "both" are displayed on the display 2.

Subsequently at Step S84, the processing unit 22 determines whether any of the items listed on the display 2 is selected. When it is determined that none of the items listed on the display 2 is selected (No at Step S84), then the processing unit 22 makes the processing standby at Step S84.

When it is determined that an item is selected from the items displayed on the display 2 (Yes at Step S84), then at Step S86, the processing unit 22 sets a compensation parameter for alleviating the selected dissatisfaction with the sound to the output sound compensation unit 34 by the compensation parameter setting unit 22a. For example, when the item 54b "low-pitched sound" is selected as illustrated in FIG.

19B, the processing unit 22 sets a compensation parameter for increasing the gain for the low-pitched sound to the output sound compensation unit 34 by the compensation parameter setting unit 22*a*. Then, the processing unit 22 proceeds the processing to Step S72.

Accordingly, the compensation parameter can be set to suit the user's hearing, and thus, the sound which can be more easily heard by the user can be output.

By performing the loop from Step S72 to Step S86, the processing unit 22 can converge the compensation parameter to the value suitable for the user and output the sound which can be more easily heard by the user.

[Embodiment 2]

Figure 20:
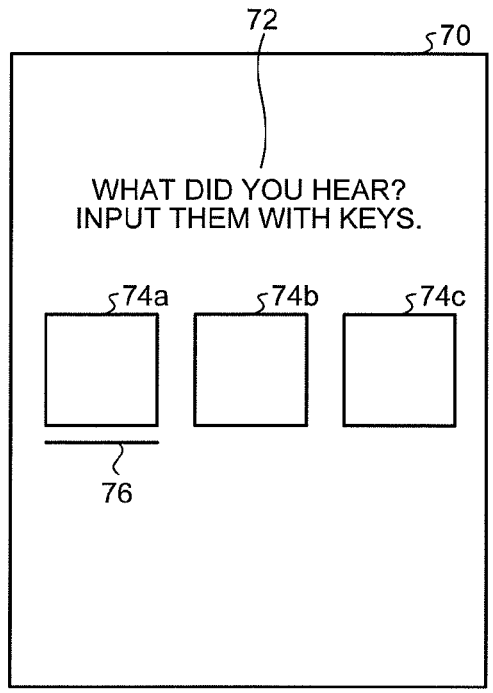
FIG. 20 is an illustration for describing an operation of the mobile electronic device according to Embodiment 2.
Figure 21:
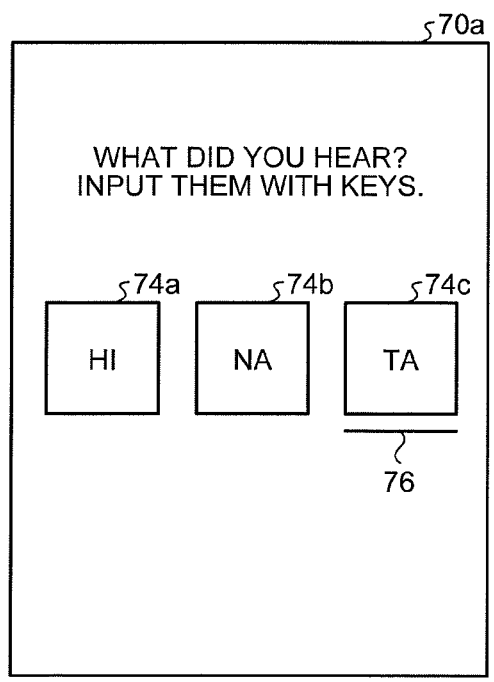
FIG. 21 is an illustration for describing an operation of the mobile electronic device according to Embodiment 2.
Figure 22:
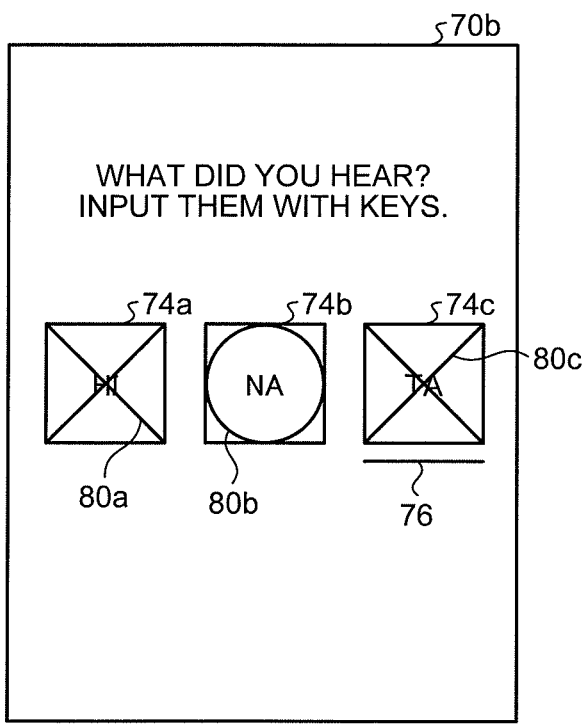
FIG. 22 is an illustration for describing an operation of the mobile electronic device according to Embodiment 2.

A compensation parameter setting operation of the mobile electronic device according to Embodiment 2 will be described with reference to FIGS. 20 to 24. FIGS. 20 to 22 are illustrations for describing operations of the mobile electronic device according to Embodiment 2, respectively. More specifically, they are diagrams illustrating screens displayed on the display 2 in the setting operation of the compensation parameter. When a setting function of the compensation parameter is activated, the mobile electronic device 1 first of all generates a presentation sound by the presentation sound generation unit 22*d*, and outputs the presentation sound from the receiver 16 or the speaker 17. In this embodiment, the presentation sound refers to a voice to be heard by the user in setting a compensation parameter, and is a word or a sentence. Preferably, a word or a sentence which is likely to be misheard is used as the presentation sound. As the presentation sound, "A-N-ZE-N" (meaning 'safe' in Japanese), "KA-N-ZE-N" (meaning 'complete' in Japanese), or "DA-N-ZE-N" (meaning 'absolutely' in Japanese), for example, can be used. "A-N-ZE-N", "KA-N-ZE-N", and "DA-N-ZE-N" are sounds which are likely to be misheard for each other. As the presentation sound, "U-RI-A-GE" (meaning 'sales' in Japanese), "O-MI-YA-GE" (meaning 'souvenir' in Japanese), or "MO-MI-A-GE" (meaning 'sideburns' in Japanese), for example, can also be used. Other than those words, "KA-N-KYO" (meaning 'environment' in Japanese), "HA-N-KYO" (meaning 'echo' in Japanese), or "TAN-KYU" (meaning 'pursuit' in Japanese) can also be used. A case where "I-NA-KA" (meaning "countryside" in Japanese) is output as the presentation sound will be described below. Preferably, the sound barely below the set unpleasant threshold (for example, the sound slightly smaller than the unpleasant threshold), and the sound barely above the set audible threshold (for example, the sound slightly louder than the audible threshold) are used so that the unpleasant threshold and the audible threshold can be set.

The mobile electronic device 1 outputs the presentation sound, then displays a screen 70 illustrated in FIG. 20. The screen 70 is a screen for inputting a heard sound, and a message 72, display fields 74*a*, 74*b*, and 74*c*, and a cursor 76 are displayed thereon. The message 72, which is for prompting the user to input, i.e., for suggesting an operation to be performed by the user, is a sentence "What did you hear? Input them with keys." The display fields 74*a*, 74*b*, and 74*c* are display areas for displaying the characters input by the user operating the operating unit 13, and are displayed as input fields by the number corresponding to the number of characters of the presentation sound, i.e., as three display fields corresponding to "I-NA-KA", in this embodiment. The cursor 76 is an indicator indicating which input field is to be input with a character, and in FIG. 20, it is displayed below the display field 74*a*.

When the operating unit 13 is operated and characters are input while the screen 70 illustrated in FIG. 20 is displayed, the mobile electronic device 1 displays the input characters in the display fields 74*a*, 74*b*, and 74*c*. Here, on the screen 70*a* illustrated in FIG. 21, "HI-NA-TA" are input as the characters. On the screen 70*a*, "HI" is displayed in the display field 74*a*, "NA" is displayed in the display field 74*b*, and "TA" is displayed in the display field 74*c*. The cursor 76 is displayed below the display field 74*c*.

When "HI-NA-TA" are input as the characters as illustrated on the screen 70*a* in FIG. 21, the mobile electronic device 1 compares the characters of the presentation sound with the input characters and, based on the comparison, sets the compensation parameter. Specifically, the mobile electronic device 1 analyzes "I-NA-KA" and "HI-NA-TA" into vowels and consonants to compare "INAKA" with "HINATA". Since both "INAKA" and "HINATA" have vowels "I", "A", and "A", the vowels agree with each other. To the contrary, the syllable without a consonant is misheard for that with a consonant "H", and the consonant "K" is misheard for the consonant "T". Based on the above described results, the thresholds for the objective sounds, i.e., in the embodiment, the thresholds for frequency ranges corresponding to the consonants "H", "K", "T" (the unpleasant threshold or the audible threshold) are adjusted and set.

As illustrated in FIG. 22, the mobile electronic device 1 displays the screen 70*b* for notifying the user of whether the characters of the presentation sound agree with the input characters. On the screen 70*b*, "HI" is displayed in the display field 74*a*, "NA" is displayed in the display field 74*b*, and "TA" is displayed in the display field 74*c*. In addition, on the screen 70*b*, a symbol 80*a* indicating disagreement is superimposed on the display field 74*a*, a symbol 80*b* indicating agreement is superimposed on the display field 74*b*, and a symbol 80*c* indicating disagreement is superimposed on the display field 74*c*. The mobile electronic device 1 outputs the presentation sound and performs control while displaying the screen on the display in the above described manner, so that it adjusts the compensation parameters for each frequency range, each vowel, each voiced consonant, and each voiceless consonant.

Figure 23:
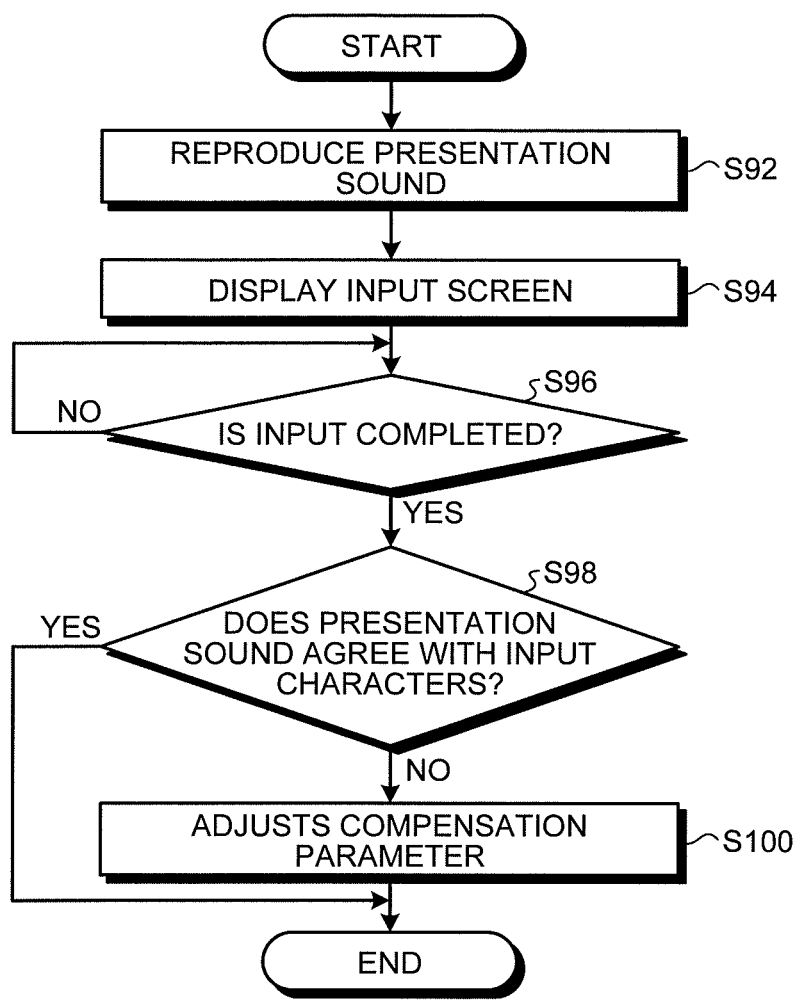
FIG. 23 is a flowchart for describing an exemplary operation of the mobile electronic device according to Embodiment 2.

A compensation parameter setting operation of the mobile electronic device according to Embodiment 2 will be described more in detail with reference to FIG. 23. FIG. 23 is a flowchart describing an exemplary operation of the mobile electronic device according to Embodiment 2. The operation described in FIG. 23 may be processed by executing an application stored in the storage unit 24. The program may be obtained by downloading from an external source.

First of all, the processing unit 22 of the mobile electronic device 1 reproduces the presentation sound (test sound) at Step S92. That is, the processing unit 22 of the mobile electronic device 1 generates a presentation sound (test sound) by the presentation sound generation unit 22*d*, and outputs the presentation sound from the receiver 16 or the speaker 17 via the sound processing unit 30. As described above, a word or a sentence which is likely to be misheard is preferably used as the presentation sound. Preferably, the mobile electronic device 1 outputs the presentation sound with the sound barely below the set unpleasant threshold (for example, the sound slightly smaller than the unpleasant threshold) and the sound barely above the set audible threshold (for example, the sound slightly louder than the audible threshold).

The presentation sound is reproduced at Step S92, then at Step S94, the processing unit 22 displays an input screen. That is, a screen is displayed for inputting what the user heard as the presentation sound, i.e., what words or sentences the user heard as the presentation sound as above described FIG. 20. When the input screen is displayed at Step S94, then at Step S96, the processing unit 22 determines whether the input is completed. When the characters by the required number are input or when a certain time period has passed, the processing unit 22 determines that the input is completed. When it is determined that the input is not completed at Step S96 (No at Step S96), the processing unit 22 proceeds to Step S96. That is, the processing unit 22 repeats the processing of Step S96 until the input is completed. When the operating unit 13 is operated and characters are input during the processing of Step S96, the processing unit 22 performs control reflecting the input characters.

When it is determined that the input is completed at Step S96 (Yes at Step S96), then at Step S98, the processing unit 22 determines whether the presentation sound agrees with the input characters. When it is determined that the presentation sound agrees with the input characters at Step S98 (Yes at Step S98), the processing unit 22 finishes the processing. When it is determined that the presentation sound does not agree with the input characters at Step S98 (No at Step S98), then at Step S100, the processing unit 22 adjusts the compensation parameter and finishes the processing.

Figure 24:
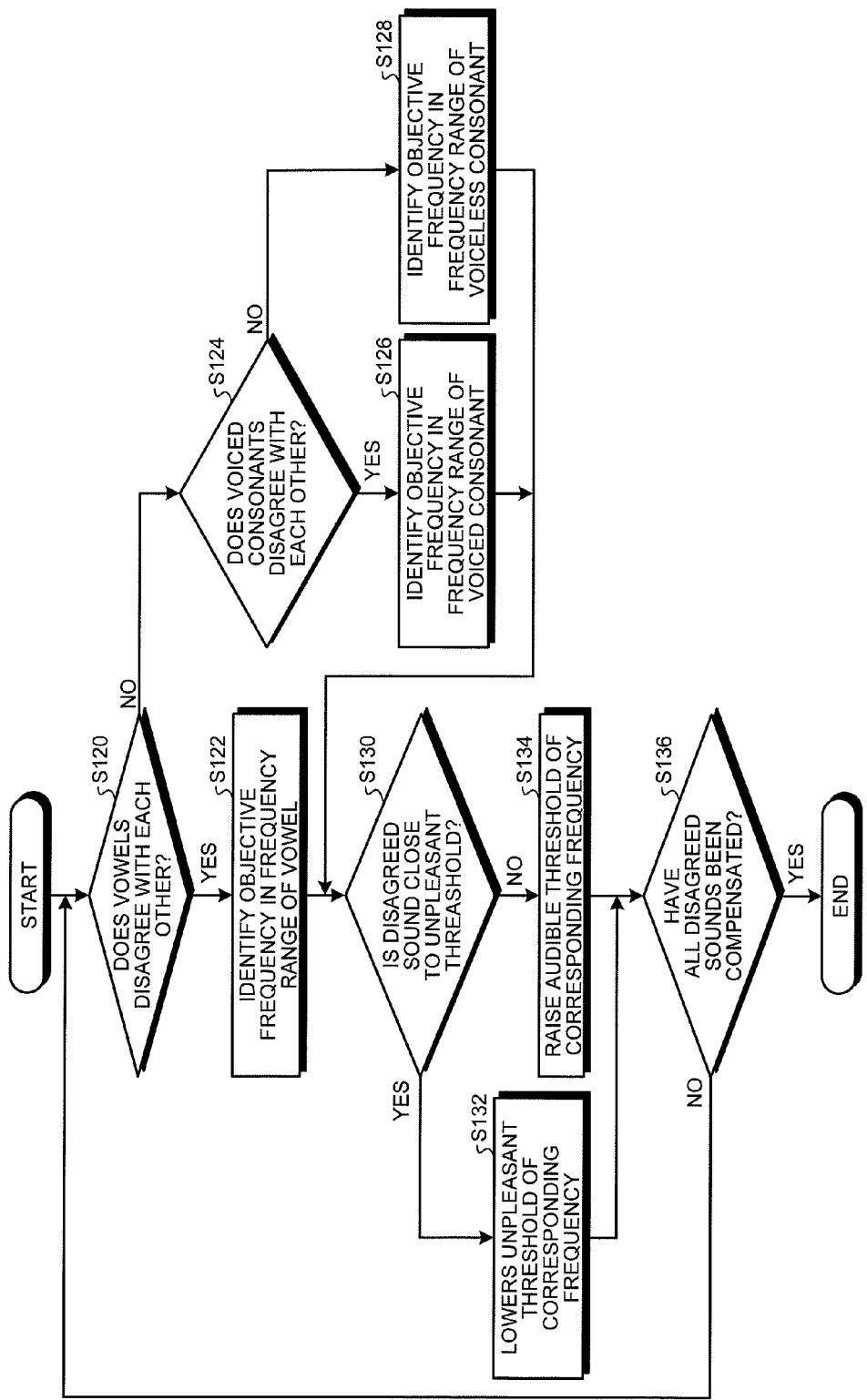
FIG. 24 is a flowchart for describing an exemplary operation of the mobile electronic device according to Embodiment 2.

A processing of adjusting the compensation parameter according to Embodiment 2 based on that the presentation sound does not agree with the input characters at Step S100 will be described with reference to FIG. 24. FIG. 24 is a flowchart describing an exemplary operation of the mobile electronic device according to Embodiment 2. Also the operation described in FIG. 24 may be processed by executing an application stored in the storage unit 24. The program may be obtained by downloading from an external source.

First of all, at Step S120, the processing unit 22 determines whether the vowels disagree with each other. When it is determined that the vowels disagree with each other at Step S120 (Yes at Step S120), then at Step S122, the processing unit 22 identifies the objective frequency in the frequency range of the vowel. That is, the frequency band or one or more frequencies corresponding to the disagreed vowel(s) are identified. When the frequency is identified at Step S122, the processing unit 22 proceeds to Step S130.

When it is determined that the vowels do not disagree with each other at Step S120 (No at Step S120), i.e., that all the vowels agree with each other, then at Step S124, the processing unit 22 determines whether the voiced consonants disagree with each other. When it is determined that the voiced consonants disagree with each other at Step S124 (Yes at Step S124), then at Step S126, the processing unit 22 identifies the objective frequency in the frequency range of the voiced consonant. That is, the frequency band or one or more frequencies corresponding to the disagreed voiced consonant(s) are identified. When the frequency is identified at Step S126, the processing unit 22 proceeds to Step S130.

When it is determined that the voiced consonants do not disagree with each other at Step S124 (No at Step S124), i.e., that the disagreed sound is a voiceless consonant, then at Step S128, the processing unit 22 identifies the objective frequency in the frequency range of the voiceless consonant. That is, the frequency band or one or more frequencies corresponding to the disagreed voiceless consonant are identified. When the frequency is identified at Step S128, the processing unit 22 proceeds to Step S130.

When the processing of Step S122, Step S126, or Step S128 finishes, then at Step S130, the processing unit 22 determines whether the output of the disagreed sound is close to the unpleasant threshold. That is, at Step S130, the processing unit 22 determines whether the output volume of the disagreed sound is close to the unpleasant threshold or to the audible threshold to determine whether the cause of the mishearing is that the sound louder than the unpleasant threshold for the user or the sound smaller than the audible threshold for the user.

When it is determined that the output of the disagreed sound is close to the unpleasant threshold at Step S130, i.e., that the output of the disagreed sound is closer to the unpleasant threshold than to the audible threshold (Yes at Step S130), then at Step S132, the processing unit 22 lowers the unpleasant threshold of the corresponding frequency. That is, the processing unit 22 makes the unpleasant threshold of the frequency to be adjusted a lower value. When the processing of Step S132 finishes, the processing unit 22 proceeds to Step S136.

When it is determined that the output of the disagreed sound is not close to the unpleasant threshold at Step S130, i.e., that the output of the disagreed sound is closer to the audible threshold than to the unpleasant threshold (No at Step S130), then at step S134, the processing unit 22 raises the audible threshold of the corresponding frequency. That is, the processing unit 22 makes the audible threshold of the frequency to be adjusted a higher value. When the processing of Step S134 finishes, the processing unit 22 proceeds to Step S136.

When the processing of Step S132 or Step S134 finishes, then at Step S136, the processing unit 22 determines whether all the disagreed sounds have been compensated, i.e., whether a compensation processing on the disagreed sounds has been completed. When it is determined at Step S136 that not all the disagreed sounds has been compensated (No at Step S136), i.e., a disagreed sound remains to be subjected to the compensation processing, the processing unit 22 proceeds to Step S120 and repeats the above described processing. Consequently, the processing unit 22 performs the compensation processing on the threshold for all the sounds determined as disagreed. When it is determined at Step S136 that all the disagreed sounds has been compensated (Yes at Step S136), the processing unit 22 finishes the processing.

The mobile electronic device 1 sets the compensation parameter for each frequency in the above described manner. When a sound signal is input, the mobile electronic device 1 compensates the sound signal based on the compensation parameter set by the output sound compensation unit 34 and outputs it to the sound processing unit 30. Accordingly, the mobile electronic device 1 can compensate the sound signal by the compensation parameter which is set according to the user's hearing (how the sound is heard, the hearing characteristics) and can output the sound which can be more easily heard by the user.

Further, by repeatedly performing the flow described in FIGS. 23 and 24 with the presentation sounds of various words and sentences, the processing unit 22 can make the compensation parameter converged to the value suitable for the user and output the sound which can be more easily heard by the user.

By regularly (for example, every three months, every six months, or the like) performing the flow described in FIGS. 23 and 24, the processing unit 22 can output the sound which can be more easily heard by the user even if the user's hearing ability has changed.

The processing unit 22 may use a word as the presentation sound, allow the user to input a heard word, and compare the words, so that the compensation processing can be performed by using the language which would be practically heard during a telephone communication and viewing of a television broadcast. Consequently, the compensation parameter can be more adequately adjusted, so that a conversation over the telephone and viewing of a television broadcast can be more facilitated.

The processing unit 22 analyzes the presentation sound into vowels, voiced consonants, and voiceless consonants and sets the compensation parameter for each frequency corresponding to each of the vowels as in the embodiment, each of the voiced consonants, and each of the voiceless consonants as in the embodiment to output the sound which can be more easily heard by the user.

Since the heard sound can be input as characters, the processing unit 22 can detect the user's input surely and without an error, thus, can more precisely perform compensation on the sound. Further, while adjusting the compensation parameter, the mobile electronic device 1 allows the user to input the characters as in the embodiment and displays the result, i.e., the result of whether the characters agree with the sound on the display 2, so that the user can understand that the sounds gradually become to be easily heard. Consequently, it can allow the user to set the compensation parameter with much satisfaction and little stress. Also, it can allow the user to set the compensation parameter as such that the user plays a video game.

Although the number of the input fields for inputting the characters is the number corresponding to the characters in the above described embodiment, the present invention is not limited thereto. For example, a screen for inputting a text may be simply displayed.

The mobile electronic device 1 may use various output methods for the method of outputting the presentation sound. For example, the mobile electronic device 1 may use a previously set sound or may sample the sound used in a call and use it. Alternatively, it may set the compensation parameter by having a specific intended party speak out prepared text information, obtaining the text information and the sound information, and having the user input the character information of what the user heard while the user is listening to the sound information. By using a voice of a specific party as the presentation sound, the voice of the specific party can be made more easily heard by the user, so that the telephone call with the specific party can be more facilitated.

The processing unit 22 preferably sets the compensation parameter correspondingly to the frequency practically output by the sound processing unit 30, and more preferably, sets the compensation parameter correspondingly to the frequency used in the telephone communication. By setting the compensation parameter for the practically used frequency, the sound output from the mobile electronic device 1 can be made more easily heard by the user. Preferably, the compensation parameter is set for the frequency such as the frequency used in CELP (code-excited linear predictive coding), EVRC (enhanced variable rate codec), and AMR (adaptive multi-rate). Although the Japanese language is taken as an example in Embodiment 2, the embodiment is also the case with various languages including English, German, Spanish, Portuguese, Chinese, Korean, or the like.

Although the compensation parameter is set by the processing unit 22 in the embodiment, the present invention is not limited thereto. The mobile electronic device 1 may perform the processing processes by a server which can communicate with the mobile electronic device 1 via the communication unit 26. That is, the processing processes may be performed externally. In that case, the mobile electronic device 1 performs such processing as outputting/displaying of the sound/image transmitted from the server, and transmits operations input by the user to the server as data. By thus causing the server to perform the processing and setting of the compensation parameter, the load to the mobile electronic device 1 can be reduced. Also, the server which communicates with the mobile electronic device 1 may previously set the compensation parameter, so that the server compensates the sound signal based on the compensation parameter. That is, a server and the mobile electronic device 1 may be combined into a system for performing the above described processing. Consequently, since the mobile electronic device 1 can receive a previously compensated sound signal, the mobile electronic device 1 may be adapted not to perform the compensation processing by itself.

Figure 25:
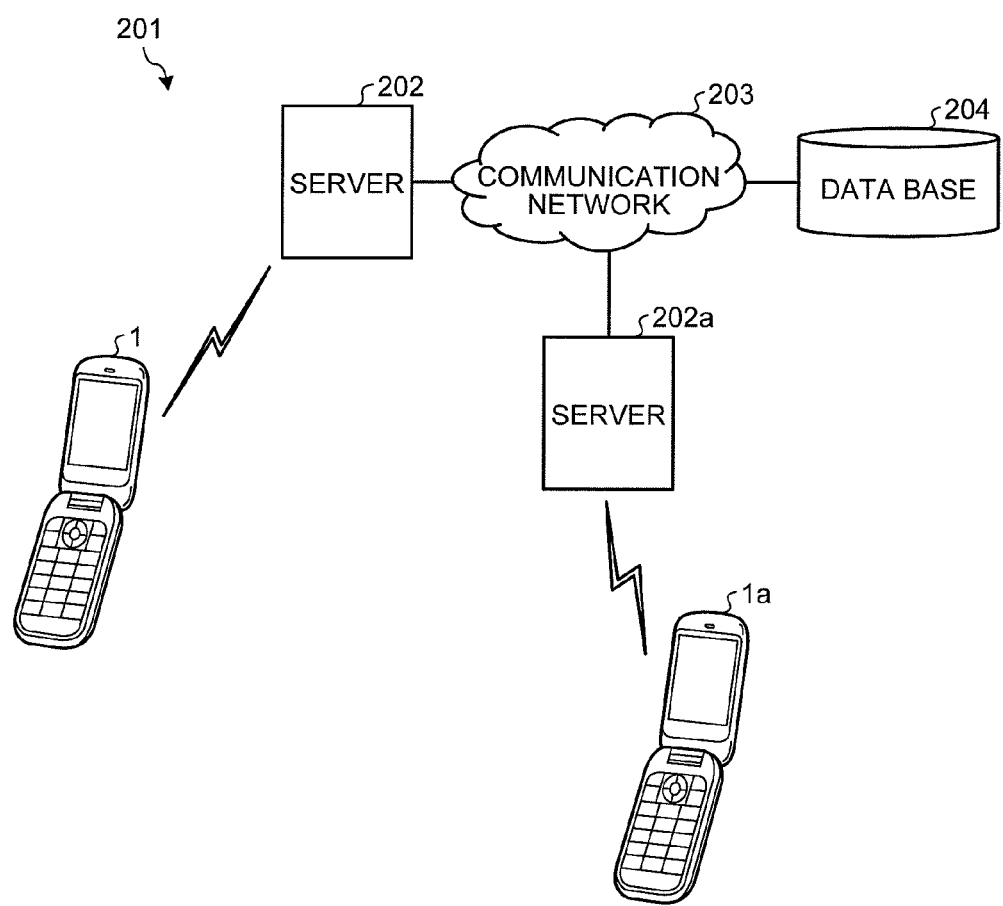
FIG. 25 is a diagram schematically illustrating a configuration of a communications system including a mobile electronic device.

FIG. 25 is a diagram schematically illustrating a configuration of a communications system including a mobile electronic device. The communications system (sound control system) 201 illustrated in FIG. 25 includes mobile electronic devices 1, 1a, servers 202, 202a, a communication network 203, and a database 204. The number of components included in the communications system 201 is not specifically limited, and each component may include a plurality of devices. For example, two or more units of each of the mobile electronic devices 1, 1a may be provided in each of the servers 202, 202a.

The server 202, which has various types of data including information for identifying each communication device (telephone number, address), communicates with the mobile electronic device 1 via the communication network to supply the various types of information to the mobile electronic device 1. The server 202 and the mobile electronic device 1 communicates with each other via the communication network, which includes a base station and a relay station and wirelessly transmits/receives communication waves. Various communication methods may be used in the communication network as far as the method enables communication between the server 202 and the mobile electronic device 1. For example, a satellite channel may be used for the communication.

The servers 202, 202a also relays information such that they receive information from the mobile electronic device 1 and, based on the information, communicates the information to another communication device via the communication network 203. That is, the server 202 aggregates and stores pieces of information transmitted from the respective communication devices, and supplies (provides) the aggregated information to the communication devices as required. The server 202a can process (add processing on) the aggregated information and supply it to the communication device.

The communication network 203 includes an exchange system, and wired or wireless communication paths. The communication network 203 communicates information between a communication device and another communication device via the wired and wireless communication lines. Specifically, the communication network 203 communicates information between the server 202 and the server 202a, and communicates information between the servers 202, 202a and the database 204. The communication network 203 may or may not be the same communication network which connects the server 202 with the mobile electronic device 1. The Internet communication network may be used as the communication network 203.

The database 204 is a storage device and stores various types of data needed for the processing performed in the mobile electronic device 1 such as user information for analyzing the compensation parameter information. The database 204 supplies respective types of information stored therein to the server 202 or the server 202a via the communication network 203.

The communications system 201, which is be the system as described above, may be configured such that the mobile electronic device 1 transmits the obtained user's input to the server 202, then, the server 202 obtains necessary information from the database 204, analyzes the information to decide the compensation parameter for use, and transmits the decided compensation parameter for use to the mobile electronic device 1, then, the mobile electronic device 1 uses the transmitted compensation parameter for use. Accordingly, the mobile electronic device 1 can perform the same compensation on the output sound as described above by outputting the obtained user's input to the server 202 and using the information supplied from the server 202. Consequently, the processing load and the storage in the mobile electronic device 1 can be reduced. By using a common server as the server 202, the same compensation processing can be performed even when the communication is performed by another communication appliance.

The processing performed by the server and the processing performed by the mobile electronic device may be shared in a variety of manners. For example, the compensation processing on the output sound based on the compensation parameter may be performed by the server. Consequently, the processing by the mobile electronic device can be reduced. In the case where the server relays the calling operation between the mobile electronic device 1 and another communication appliance, this processing can be performed by compensating the sound supplied from the server to the mobile electronic device.

As far as the compensation parameter is once set by having the server 202 store the user information and the compensation parameter to determine the user and decide the compensation parameter, the compensation can be performed with the same compensation parameter even if another electronic equipment is used. Consequently, as far as any electronic device that can communicate with the server 202 is used, the user can make the electronic device output the sound easily heard by the user so that the user can easily hear the sound output from the electronic device.

Industrial Applicability

As described above, the mobile electronic device and the sound control system according to the present invention is useful for what outputs sounds.

The invention claimed is:

1. A mobile electronic device, comprising:
a sound production unit for producing a sound based on a sound signal;
an input unit for receiving input;
a processing unit configured to
cause the sound production unit to produce a sound, and
set, when a response to the produced sound is received by the input unit, a compensation parameter for adjusting sound volume for each audio frequency based on the response;
a compensation unit configured to
compensate a sound signal based on the compensation parameter, and
supply the compensated sound signal to the sound production unit; and
a display unit, wherein
the input unit is configured to receive input of operation, and
the processing unit is configured to
cause the display unit to display a list of responses to be input with respect to the sound produced by the sound production unit, and
set, when an operation of selecting a response from the displayed list of responses is received by the input unit, the compensation parameter correspondingly to the selected response.

2. The mobile electronic device according to claim 1, wherein
the input unit is configured to receive a voice, and
the processing unit is configured to
analyze the voice input into the input unit with respect to the sound produced by the sound production unit, and
set the compensation parameter correspondingly to the response based on the analysis.

3. The mobile electronic device according to claim 1, wherein
the compensation parameter is a parameter for compensating a sound to be produced from the sound production unit to make the sound have volume between an unpleasant threshold and an audible threshold.

4. The mobile electronic device according to claim 1, wherein
the processing unit is configured to cause the sound production unit to produce either or both of a sound which is smaller than an unpleasant threshold and a sound which is louder than an audible threshold.

5. The mobile electronic device according to claim 1, further comprising:
a communication unit for communicating with an external appliance; and
an analysis unit for analyzing a received voice of a call received by the communication unit, wherein
when a response to the received voice is detected, the processing unit is configured to set the compensation parameter correspondingly to the analysis made by the analysis unit and the detected response.

6. The mobile electronic device according to claim 5, wherein
the processing unit is configured to
store, when input for adjusting the received voice is detected during a call, the input for adjusting the received voice, and
set the compensation parameter correspondingly to the stored input for adjusting the received voice.

7. The mobile electronic device according to claim 5, wherein
the analysis unit is configured to perform spectrum analysis on the received voice of a call, and
the processing unit is configured to
present options for the response based on the result of the spectrum analysis, and
take a response selected from the presented options as the response to the received voice.

8. The mobile electronic device according to claim 1, wherein
the input unit is configured to receive a voice, and
the processing unit is configured to
store a response to the received voice, and
present the response to the received voice to a user in response to an instruction from the user.

9. A mobile electronic device, comprising:
a sound production unit for producing a sound based on a sound signal;
an input unit for receiving input;
a processing unit configured to
cause the sound production unit to produce a sound, and set, when a response to the produced sound is received by the input unit, a compensation parameter for adjusting sound volume for each audio frequency based on the response;

a compensation unit configured to
   compensate a sound signal based on the compensation parameter, and
   supply the compensated sound signal to the sound production unit; and a display unit for displaying, wherein the input unit is configured to receive input of operation, and the processing unit is configured to
   compare an output sound output from the sound production unit with an input character which are input from the input unit, and
   set the compensation parameter for each frequency corresponding to the sound for which the output sound does not agree with the input character.

10. The mobile electronic device according to claim 9, wherein
   the compensation parameter is a parameter for compensating a sound to be produced from the sound production unit to make the sound have volume between an unpleasant threshold and an audible threshold.

11. The mobile electronic device according to claim 10 wherein
   the processing unit is configured to
      decrease, when the sound for which the output sound does not agree with the input character is an output closer to the unpleasant threshold than to the audible threshold, the unpleasant threshold of a wavelength region for the corresponding sound, and
      increase, when the sound for which the output sound does not agree with the input character is an output closer to the audible threshold than to the unpleasant threshold, the audible threshold of a wavelength region for the corresponding sound.

12. The mobile electronic device according to claim 10, wherein
   the processing unit is configured to produce at least either of a sound which is smaller than the unpleasant threshold and a sound which is louder than the audible threshold as the output sound from the sound production unit.

13. The mobile electronic device according to claim 9, wherein
   the processing unit is configured to determine a sound by classifying the sound into a vowel, a voiced consonant, and a voiceless consonant.

\* \* \* \* \*